United States Patent
Youngman et al.

(10) Patent No.: US 7,398,492 B2
(45) Date of Patent: Jul. 8, 2008

(54) RULES AND DIRECTIVES FOR VALIDATING CORRECT DATA USED IN THE DESIGN OF SEMICONDUCTOR PRODUCTS

(75) Inventors: Todd Jason Youngman, Rochester, MN (US); John Emery Nordman, Rochester, MN (US); Scott T. Senst, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 451 days.

(21) Appl. No.: 11/017,015

(22) Filed: Dec. 20, 2004

(65) Prior Publication Data

US 2005/0273736 A1 Dec. 8, 2005

Related U.S. Application Data

(60) Provisional application No. 60/579,922, filed on Jun. 15, 2004, provisional application No. 60/577,356, filed on Jun. 3, 2004.

(51) Int. Cl.
*G06F 17/50* (2006.01)

(52) U.S. Cl. ............... 716/5; 716/4; 716/6; 716/8; 716/10; 716/11; 716/12

(58) Field of Classification Search ............... 716/1, 716/2, 4–9, 10–12, 17, 18; 713/300, 400; 712/1; 707/10; 703/11, 19; 702/120; 700/97
See application file for complete search history.

(56) References Cited

U.S. PATENT DOCUMENTS

| | | | | |
|---|---|---|---|---|
| 5,128,871 A * | 7/1992 | Schmitz | 716/17 |
| 5,452,239 A * | 9/1995 | Dai et al. | 716/17 |
| 5,603,043 A * | 2/1997 | Taylor et al. | 716/3 |
| 5,966,707 A * | 10/1999 | Van Huben et al. | 707/10 |
| 6,216,258 B1 * | 4/2001 | Mohan et al. | 716/17 |
| 6,243,851 B1 * | 6/2001 | Hwang et al. | 716/10 |
| 6,260,182 B1 * | 7/2001 | Mohan et al. | 716/12 |
| 6,292,925 B1 * | 9/2001 | Dellinger et al. | 716/8 |
| 6,385,757 B1 * | 5/2002 | Gupta et al. | 716/1 |
| 6,389,379 B1 * | 5/2002 | Lin et al. | 703/14 |
| 6,408,428 B1 * | 6/2002 | Schlansker et al. | 716/17 |
| 6,457,164 B1 * | 9/2002 | Hwang et al. | 716/8 |
| 6,539,520 B1 * | 3/2003 | Tiong et al. | 716/3 |
| 6,584,601 B1 * | 6/2003 | Kodosky et al. | 716/4 |
| 6,675,306 B1 * | 1/2004 | Baxter | 713/400 |
| 6,742,165 B2 * | 5/2004 | Lev et al. | 716/1 |
| 6,789,054 B1 * | 9/2004 | Makhlouf | 703/6 |

(Continued)

*Primary Examiner*—Jack Chiang
*Assistant Examiner*—Helen Rossoshek
(74) *Attorney, Agent, or Firm*—Christopher P. Maiorana, PC

(57) ABSTRACT

A method to validate data used in a design of a semiconductor product. The method includes (a) reading resources of an application set defining the semiconductor product in a partially fabricated state comprising fabrication layers up to and including a lowest conductive layer (b) reading a user specification that (i) is developed based upon the application set at the partially fabricated state and (ii) establishes at least one upper conductive layer added to the application set that completes the design of the semiconductor product, (c) allocating a new resource from the user specification to the design of the semiconductor product, said new resource having multiple parameters, (d) validating the allocation of the new resource against the resources of the application set and (e) propagating the allocation of the new resource and the parameters throughout a description of the semiconductor product.

26 Claims, 14 Drawing Sheets

U.S. PATENT DOCUMENTS

| | | | |
|---|---|---|---|
| 6,823,497 B2 * | 11/2004 | Schubert et al. | 716/4 |
| 6,823,502 B2 * | 11/2004 | Wingren et al. | 716/9 |
| 6,868,534 B2 * | 3/2005 | Fattouh et al. | 716/6 |
| 6,901,563 B1 * | 5/2005 | Ogami et al. | 716/2 |
| 6,909,330 B2 * | 6/2005 | Colleran et al. | 331/8 |
| 6,910,201 B2 * | 6/2005 | Byrn et al. | 716/17 |
| 6,938,236 B1 * | 8/2005 | Park et al. | 716/17 |
| 6,964,029 B2 * | 11/2005 | Poznanovic et al. | 716/7 |
| 6,988,251 B2 * | 1/2006 | Vogel | 716/2 |
| 7,003,423 B1 * | 2/2006 | Kabani et al. | 702/120 |
| 7,020,852 B2 * | 3/2006 | Oeltjen et al. | 716/1 |
| 7,032,190 B2 * | 4/2006 | Auracher et al. | 716/1 |
| 7,036,106 B1 * | 4/2006 | Wang et al. | 716/18 |
| 7,039,885 B1 * | 5/2006 | Mohan | 716/4 |
| 7,055,113 B2 * | 5/2006 | Broberg et al. | 716/1 |
| 7,062,736 B2 * | 6/2006 | Oleksinski et al. | 716/6 |
| 7,069,523 B2 * | 6/2006 | Nation et al. | 716/2 |
| 7,080,267 B2 * | 7/2006 | Gary et al. | 713/300 |
| 7,216,312 B2 * | 5/2007 | Jain et al. | 716/4 |
| 7,240,303 B1 * | 7/2007 | Schubert et al. | 716/4 |
| 2003/0121010 A1 * | 6/2003 | Aubury | 716/4 |
| 2004/0128626 A1 * | 7/2004 | Wingren et al. | 716/1 |
| 2004/0261052 A1 * | 12/2004 | Perry et al. | 716/19 |
| 2005/0080502 A1 * | 4/2005 | Chernyak et al. | 700/97 |
| 2005/0114818 A1 * | 5/2005 | Khakzadi et al. | 716/11 |
| 2005/0204316 A1 * | 9/2005 | Nebel et al. | 716/2 |
| 2005/0223347 A1 * | 10/2005 | Okuaki | 716/5 |
| 2005/0240892 A1 * | 10/2005 | Broberg et al. | 716/11 |
| 2005/0273738 A1 * | 12/2005 | Byrn et al. | 716/4 |
| 2005/0278670 A1 * | 12/2005 | Brooks et al. | 716/5 |
| 2006/0178862 A1 * | 8/2006 | Chan et al. | 703/11 |

\* cited by examiner

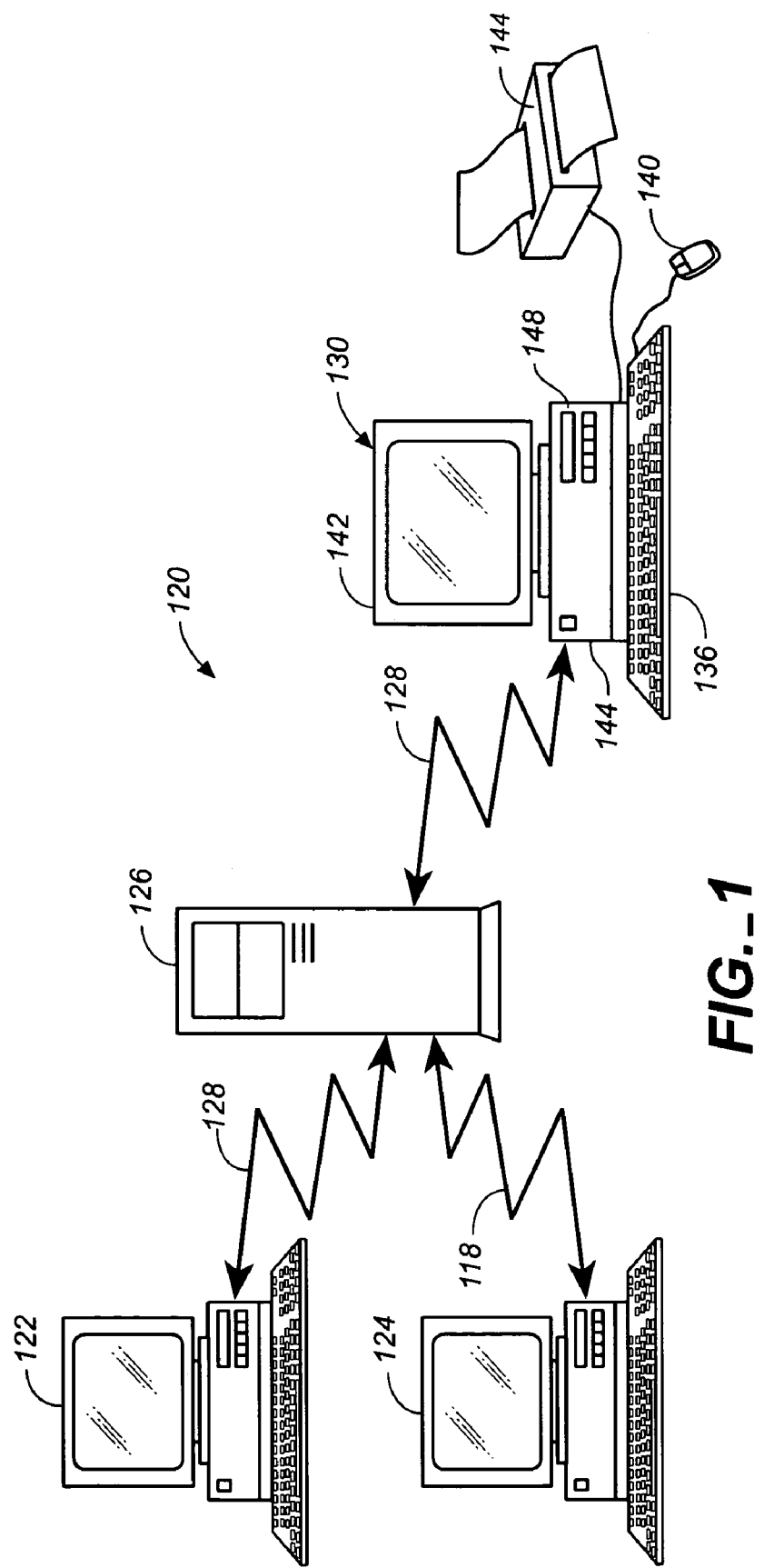
FIG._1

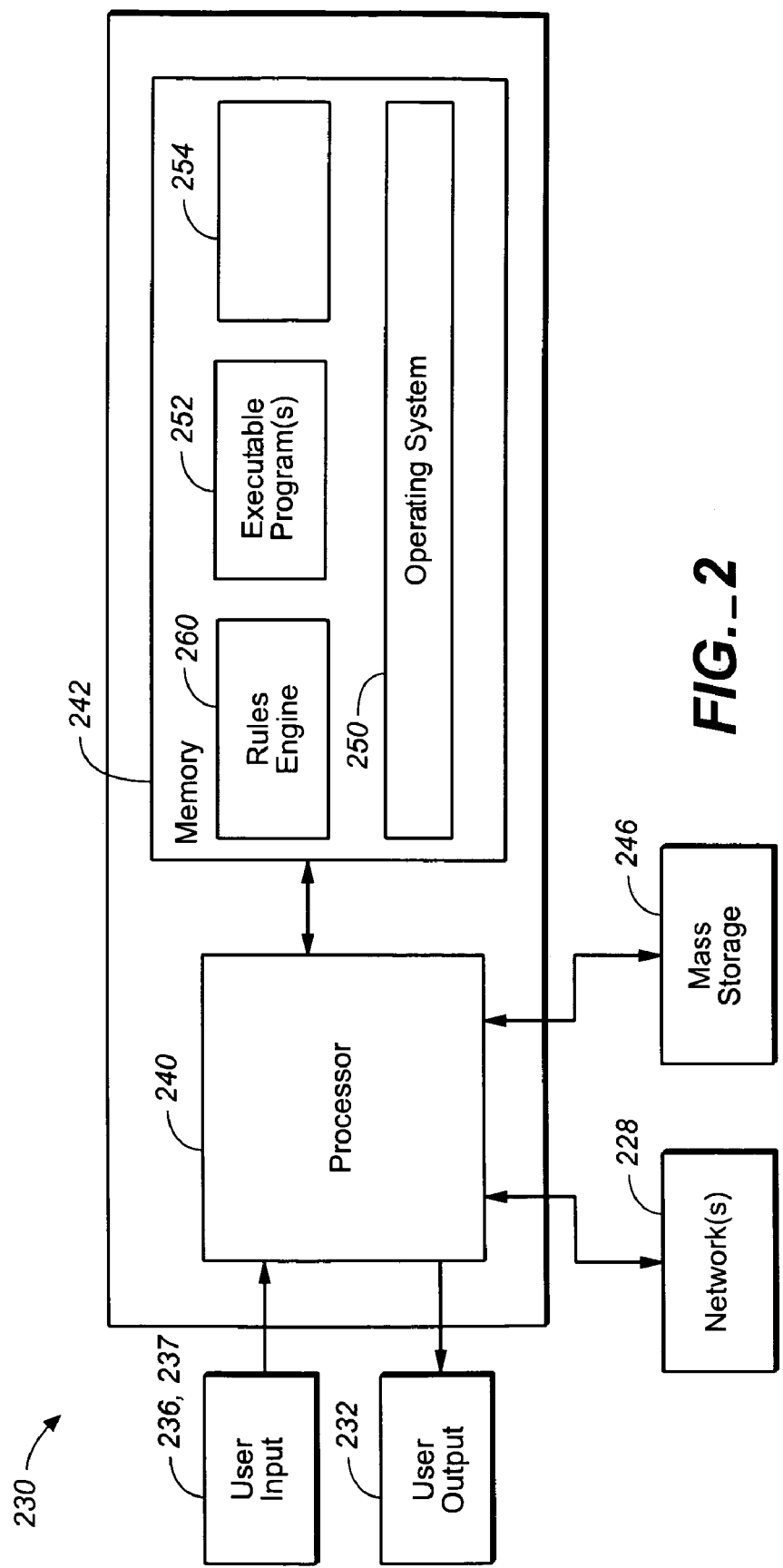
FIG._2

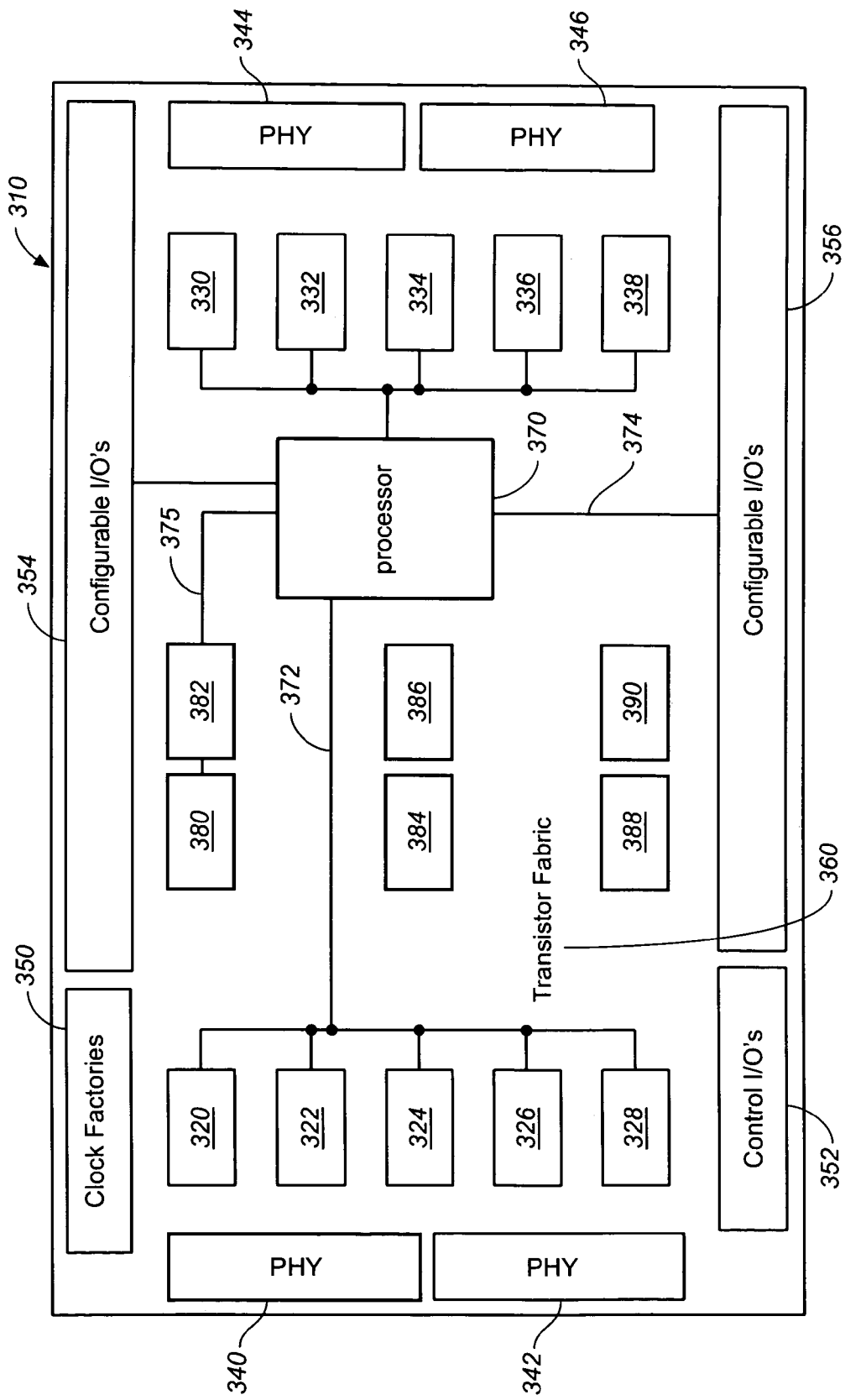
FIG._3

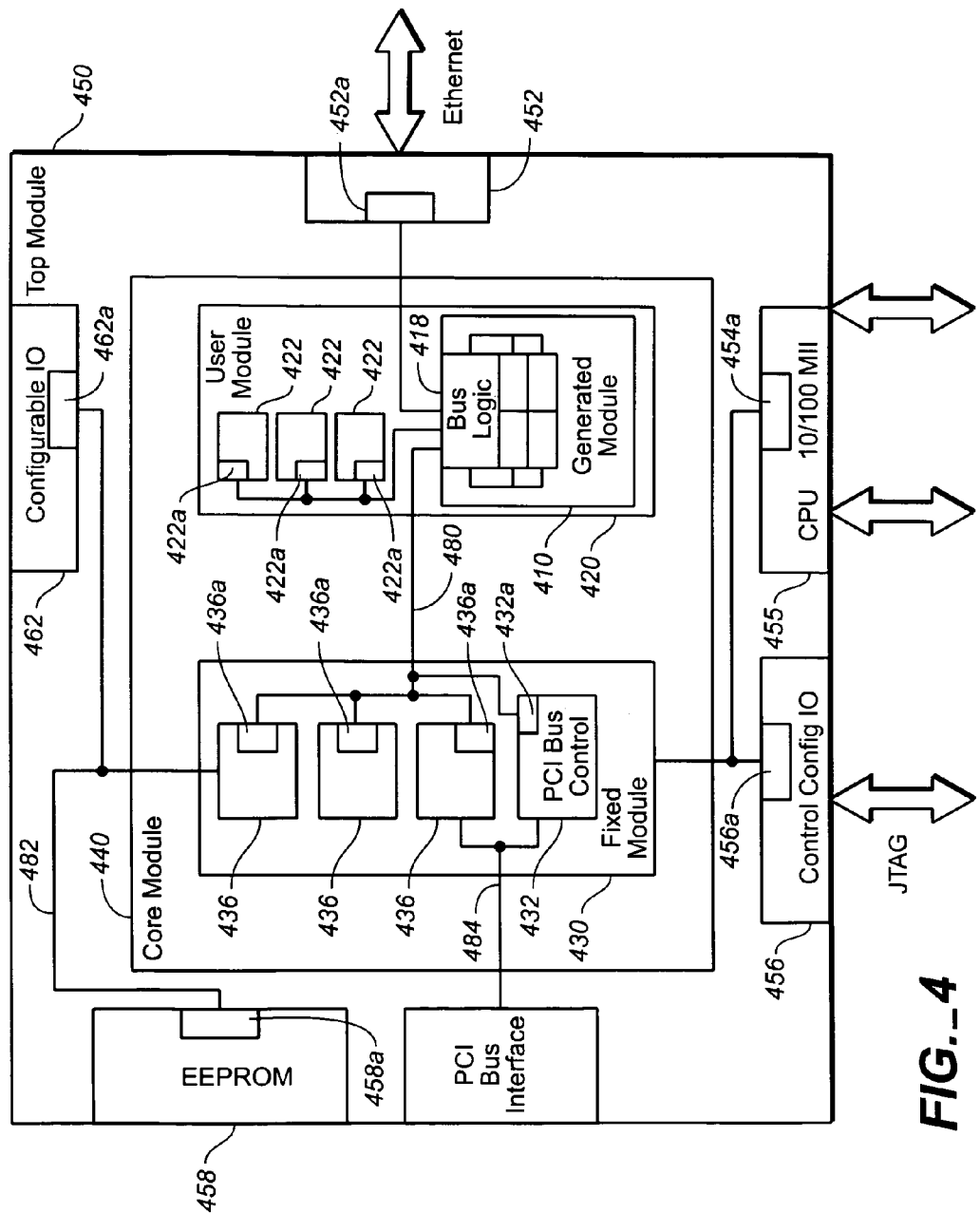
FIG._4

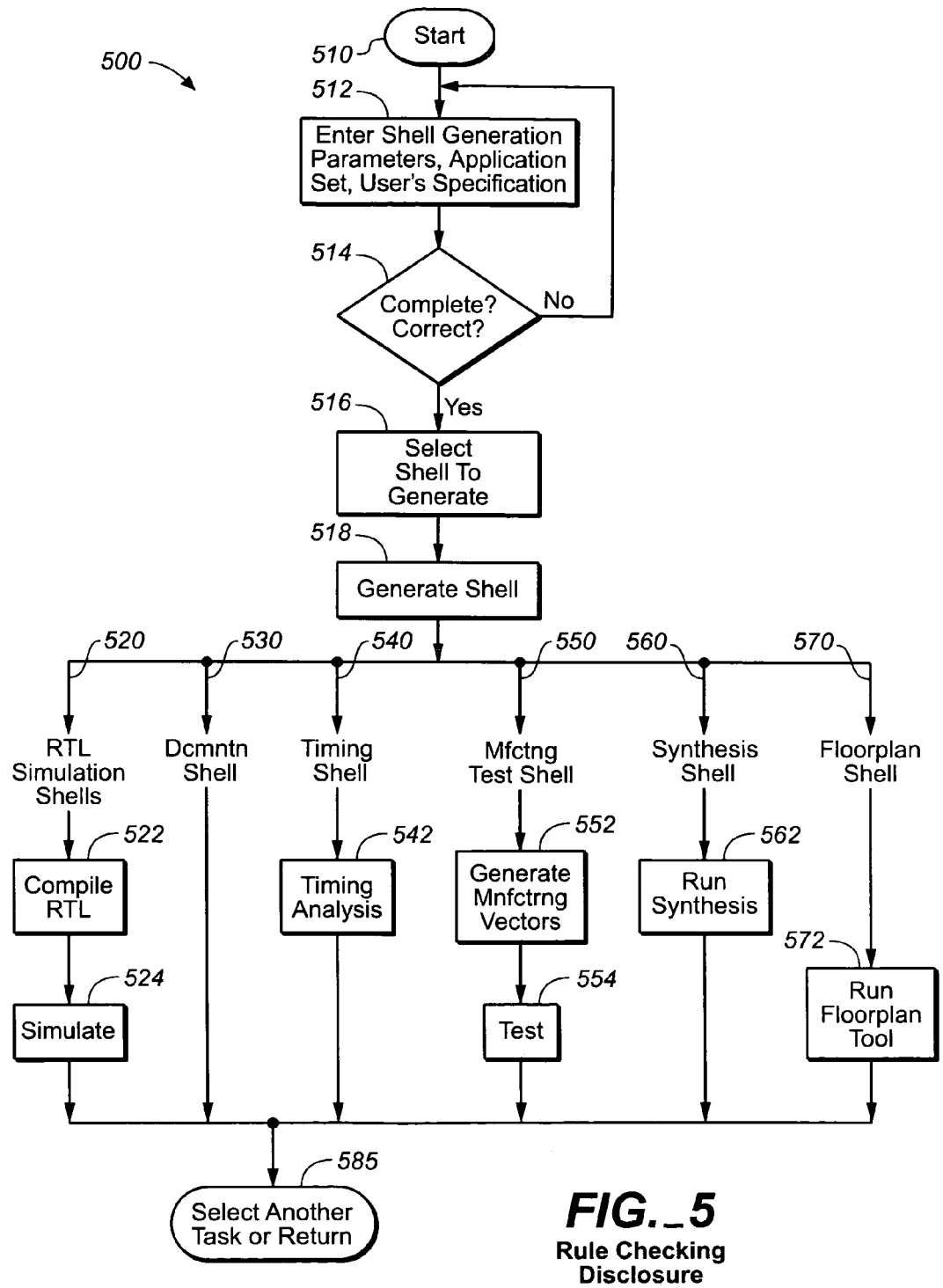
FIG._5
Rule Checking Disclosure

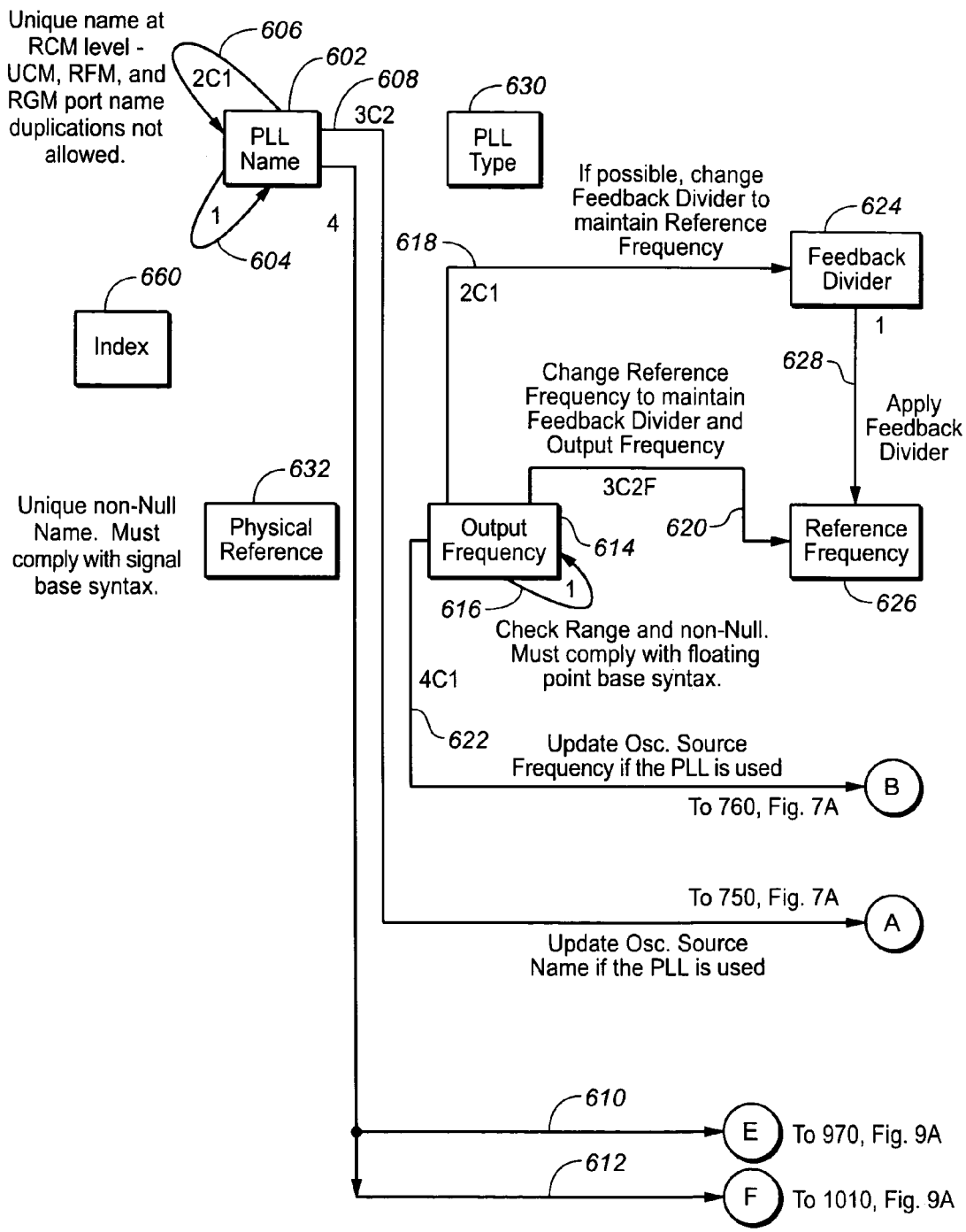
FIG._6
Rule Checking for PLL

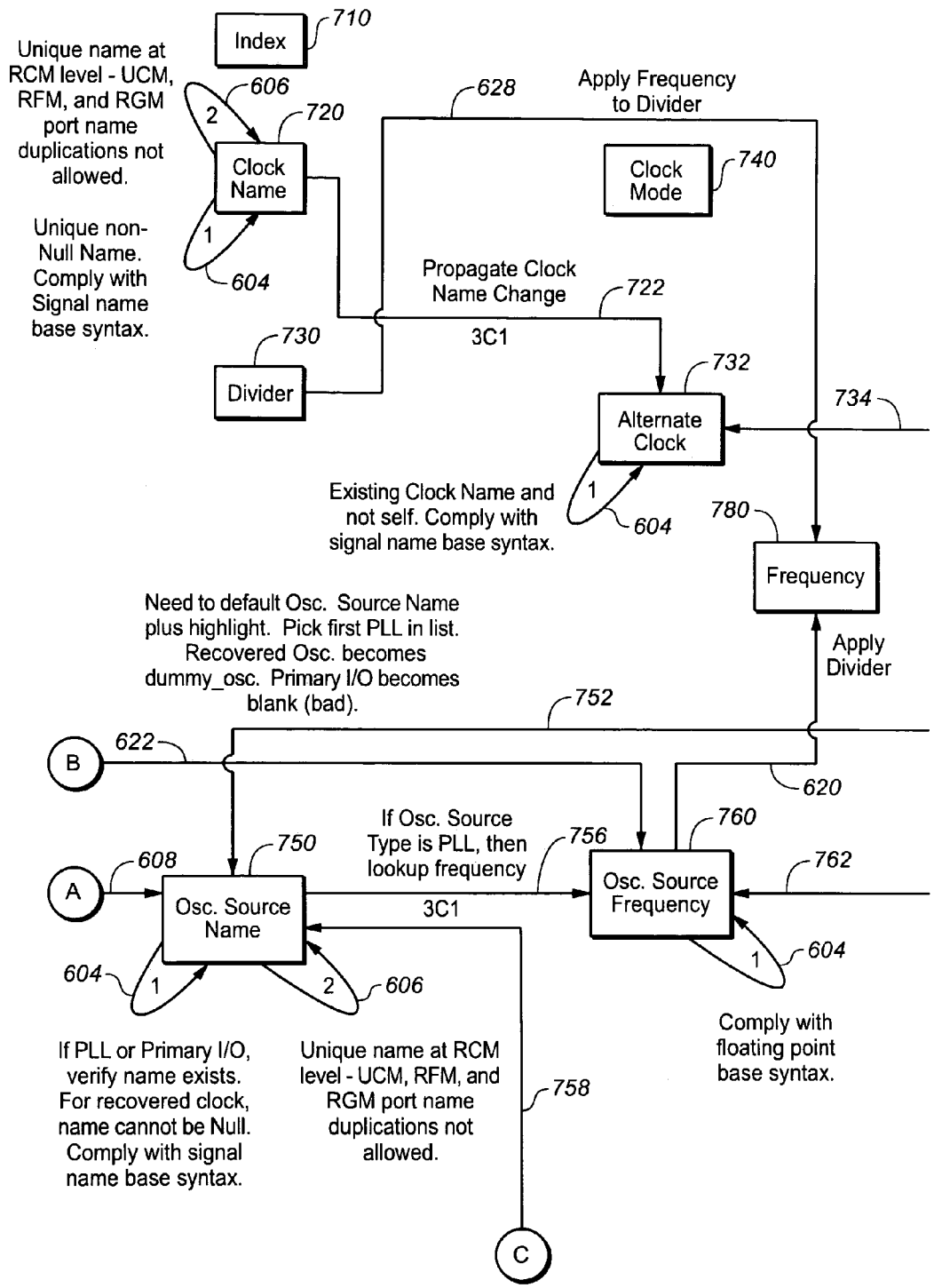
FIG._7A

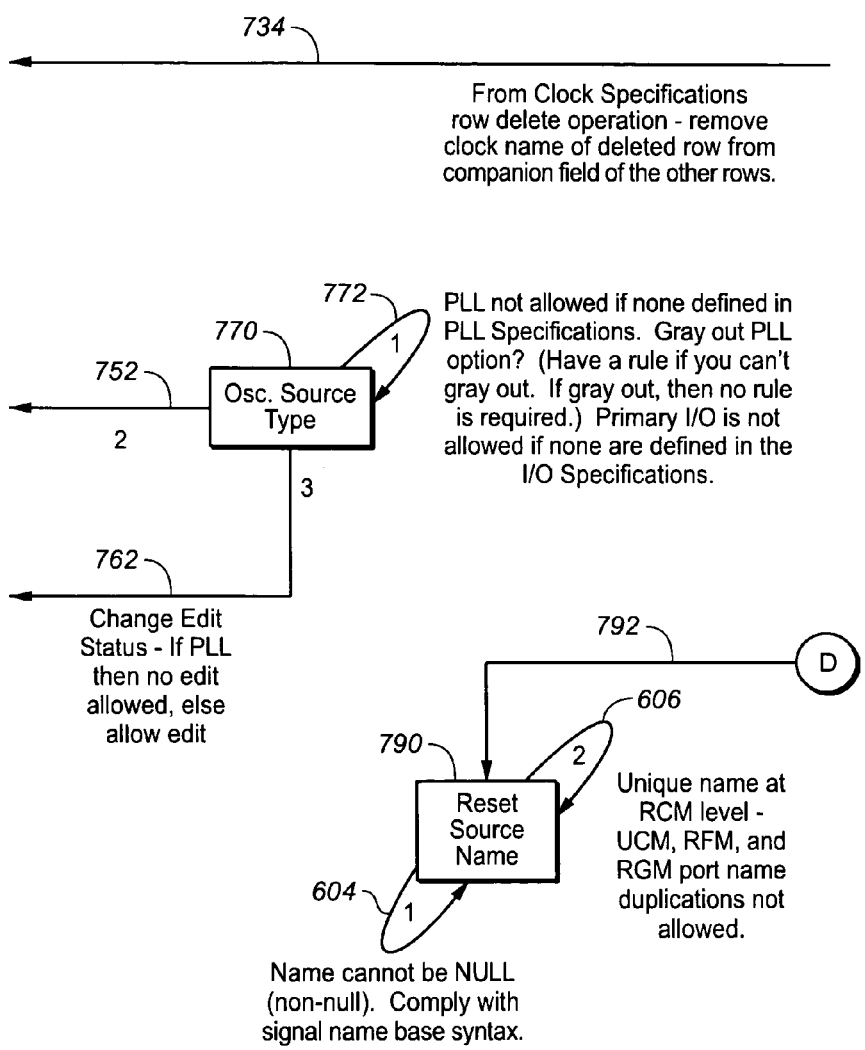
FIG._7B

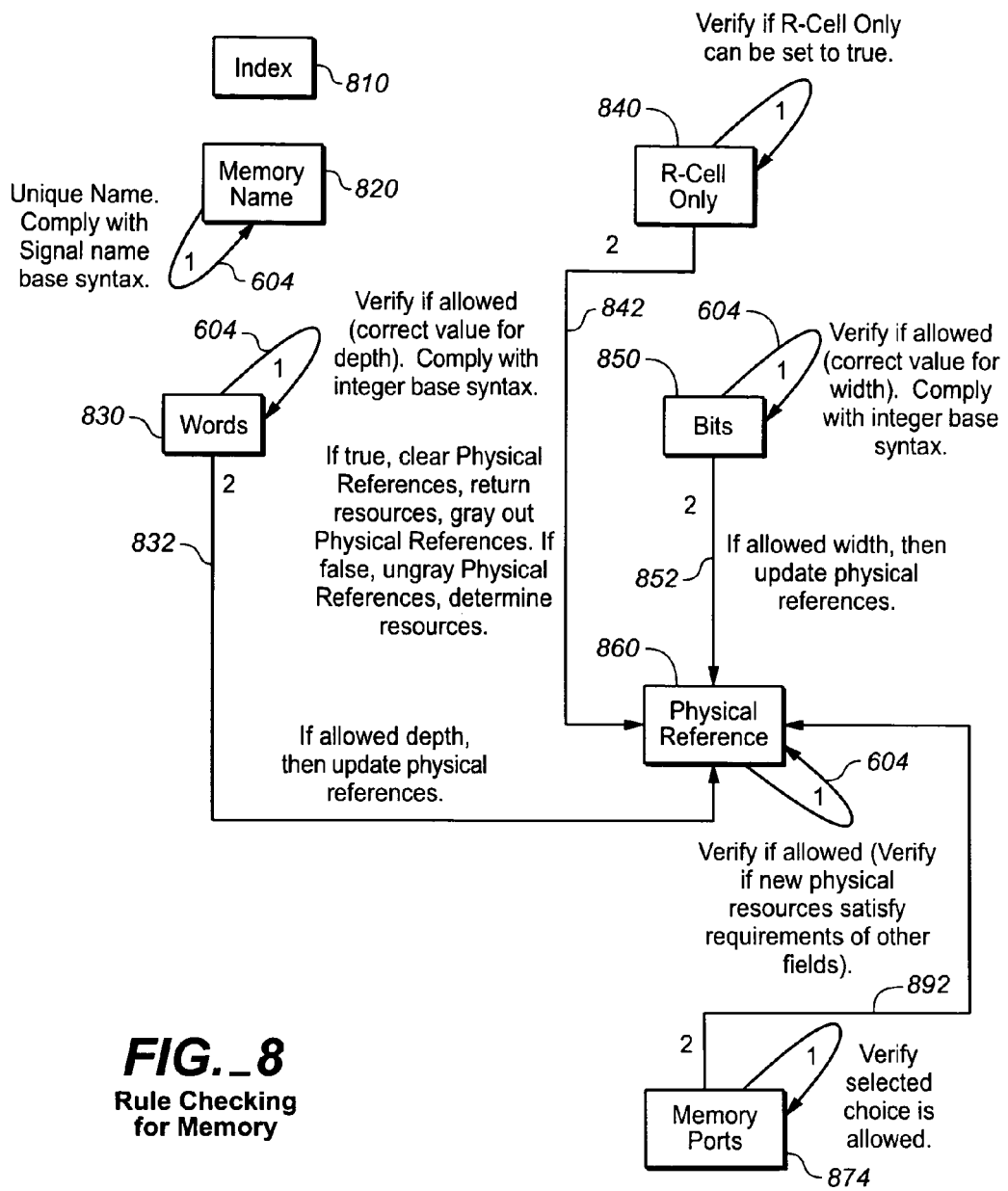
FIG._8
Rule Checking for Memory

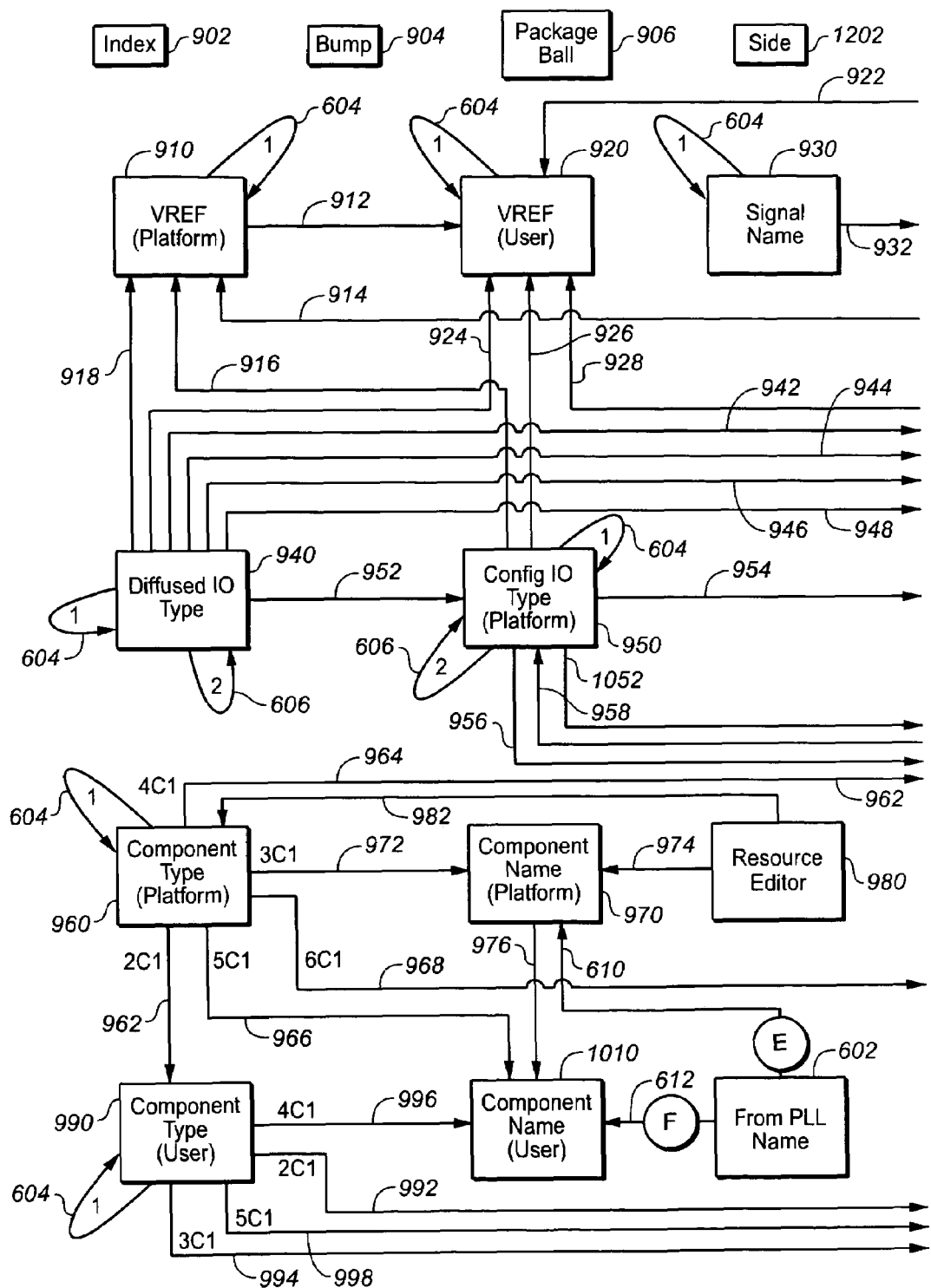
FIG._9A

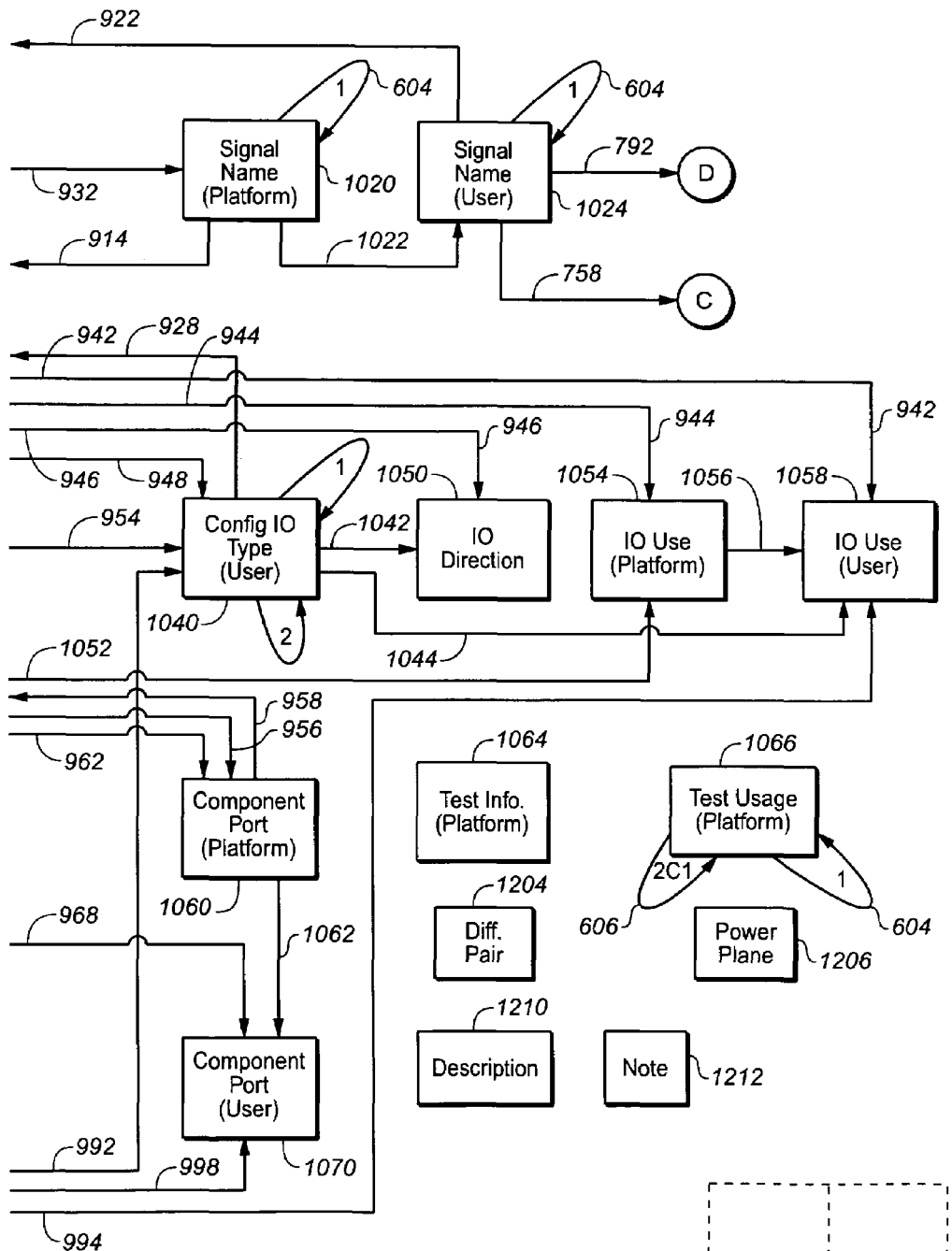
FIG._9B
FIG._9

RapidBuilder - steph_doc.rbd

File  Edit  Generate  Memories  Clocks  Tools  Options  Help

IO Specifications 1020 1024 940

| Index | Bump 906 | Package Ball 1202 | Side 1204 | Diff Pair 1206 | Power Plane | Segment | Signal Name (Platform) | Signal Name (User) | Diffused IO Type |
|---|---|---|---|---|---|---|---|---|---|
| 1 | | | LE... | | | SEGME... | | | BASEIORC |
| 2 | | | LE... | | | SEGME... | | | BASEIORC |
| 3 | | | LE... | | | SEGME... | | | BASEIORC |
| 4 | | | LE... | | | SEGME... | | | BASEIORC |
| 5 | | | LE... | | | SEGME... | | | BASEIORC |
| 6 | | | LE... | | | SEGME... | | | BASEIORC |
| 7 | | | LE | | | SEGME | | | BASEIORC |

904 902

Memory Specifications

| Index 810 | Memory Name 820 | R-Cell Only 840 | Memory Ports 874 | Words 830 | Bits 850 | Frequency (MHz) 880 | Pipeline S 890 |
|---|---|---|---|---|---|---|---|

PLL Specifications 630 632

| Index 660 602 | PLL name | PLL Type | Physical |
|---|---|---|---|
| 1 | PLL_0 | PLL12PIP... | u_PLL_0 |

Clock Specifications

| Index 710 | Clock Name 720 | Clock Mode 740 | Frequency ( 780 |
|---|---|---|---|

FIG._10  LSIL Rule Checking

1200

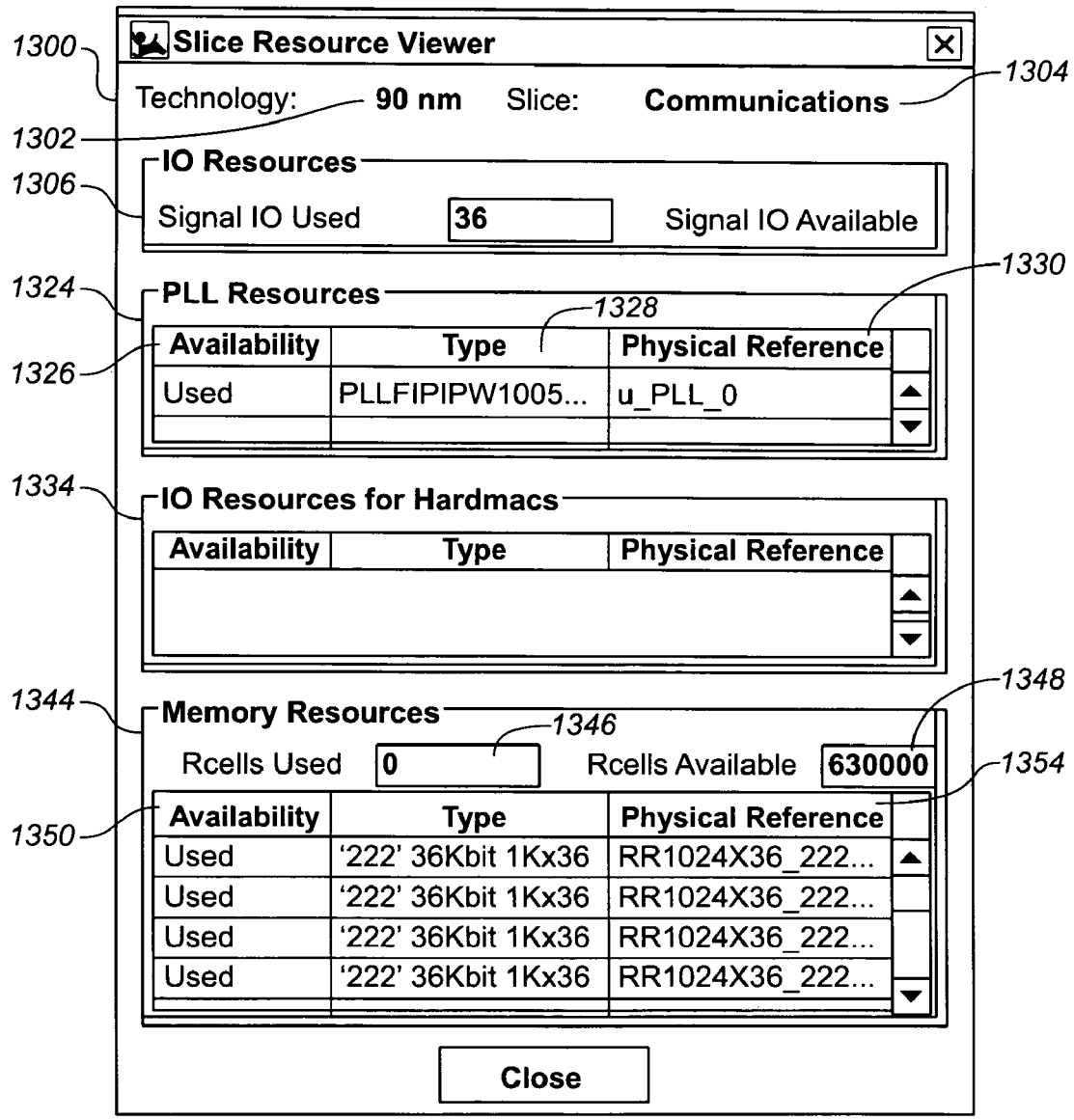
FIG._11
LSIL Rule Checking

| Index | Signal Name (Platform) | Signal Name (User) | IO USE (Platform) | IO USE (User) | Config IO Type (Platform) | Config IO Type (User) | Component Type (Platform) | Component Type (User) |
|---|---|---|---|---|---|---|---|---|
| 50 | BUMP_0 | Signal_3 | INOUT | IN | BD4CLS25... | BD4CLS25... | None | UM |
| 851 | BUMP_0 | Todd_1 | INOUT | OUT | BD4CLS33... | BD4CULS3... | None | UM |
| 845 | BUMP_0 | John_1 | INOUT | INOUT | BD4CLS33... | BD4CLS33... | None | UM |
| 848 | BUMP_0 | BUMP_... | INOUT | INOUT | BD4CLS33... | BD4CLS33... | None | None |
| 850 | BUMP_0 | BUMP_... | INOUT | INOUT | BD4CLS25... | BD4CLS25... | None | None |
| 63 | BUMP_0 | BUMP_... | INOUT | INOUT | BD4CLS25... | BD4CLS25... | None | None |
| 61 | BUMP_0 | BUMP_... | INOUT | INOUT | BD4CLS25... | BD4CLS25... | None | None |
| 58 | BUMP_0 | BUMP_... | INOUT | INOUT | BD4CLS25... | BD4CLS25... | None | None |
| 64 | BUMP_0 | BUMP_... | INOUT | INOUT | BD4CLS33... | BD4CLS33... | None | None |
| 844 | BUMP_0 | BUMP_... | INOUT | INOUT | BD4CLS25... | BD4CLS25... | None | None |
| 842 | BUMP_0 | BUMP_... | INOUT | INOUT | BD4CLS25... | BD4CLS25... | None | None |
| 69 | BUMP_0 | BUMP_... | INOUT | INOUT | BD4CLS25... | BD4CLS25... | None | None |
| 66 | BUMP_0 | BUMP_... | INOUT | INOUT | BD4CLS25... | BD4CLS25... | None | None |
| 71 | BUMP_0 | BUMP_... | INOUT | INOUT | BD4CLS25... | BD4CLS25... | None | None |
| 65 | BUMP_0 | BUMP_... | INOUT | INOUT | BD4CLS25... | BD4CLS25... | None | None |
| 77 | BUMP_0 | BUMP_... | INOUT | INOUT | BD4CLS25... | BD4CLS25... | None | None |
| 75 | BUMP_0 | BUMP_... | INOUT | INOUT | BD4CLS25... | BD4CLS25... | None | None |
| 72 | BUMP_0 | BUMP_... | INOUT | INOUT | BD4CLS25... | BD4CLS25... | None | None |

FIG._12
LSIL Rule Checking

RULES AND DIRECTIVES FOR VALIDATING CORRECT DATA USED IN THE DESIGN OF SEMICONDUCTOR PRODUCTS

RELATED APPLICATIONS

This application for an invention was disclosed in a prior U.S. Provisional Application Ser. No. 60/579,922 entitled RULES AND DIRECTIVES FOR VALIDATING CORRECT DATA USED IN THE DESIGN OF SEMICONDUCTOR PRODUCTS filed 15 Jun. 2004, that complies with the requirements of the first paragraph of 35 U.S.C. §112. It also relates to U.S. patent application filed on 6 May 2004 Ser. No. 10/840,534 entitled ASSURING CORRECT DATA ENTRY TO GENERATE SHELLS FOR A SEMICONDUCTOR PLATFORM (hereinafter referred to as CORRECT DATA ENTRY) and to U.S. Provisional Application Ser. No. 60/577,356 filed 3 June 2004 entitled LANGUAGE AND TEMPLATE FOR USE IN THE DESIGN OF SEMICONDUCTOR PRODUCTS (hereinafter referred to as the TEMPLATE ENGINE) and U.S. patent application Ser. No. 11/017,017 by the same title, filed concurrently herewith (hereinafter referred to as the TEMPLATE ENGINE), all applications owned by the same assignee as this application and all applications being incorporated by reference in their entireties.

FIELD OF THE INVENTION

This invention relates generally to the field of electronic circuit design and more particularly relates to an arrangement of rules and directives to ensure that data is correct and consistent in the design and manufacture of a semiconductor product.

BACKGROUND

An integrated circuit comprises layers of a semiconductor, usually silicon, with specific areas and specific layers having different concentrations of electron and hole carriers and/or insulators. The electrical conductivity of the layers and of the distinct areas within the layers are determined by the concentration of dopants within the area. In turn, these distinct areas interact with one another to form transistors, diodes, and other electronic devices. These specific transistors and other devices may interact with each other by field interactions or by direct electrical interconnections. Openings or windows are created for electrical connections between the layers by a combination of masking, layering, and etching additional materials on top of the wafers. These electrical interconnections may be within the semiconductor or may lie above the semiconductor areas and layers using a complex mesh of conductive layers, usually metal such as platinum, gold, aluminum, tungsten, or copper, fabricated by deposition on the surface and selective removal, leaving the electrical interconnections. Insulative layers, e.g., silicon dioxide, may separate any of these semiconductor or connectivity layers. Depending upon the interconnection topology, transistors perform Boolean logic functions like AND, OR, NOT, NOR and are referred to as gates.

Meanwhile, several types of chips have been developed that take advantage of a modular approach having areas in which the transistors and their respective functions are fixed and other areas in which the transistors and their functions are totally or partially programmable/customizable. The different proportion of fixed to programmable modules in an integrated circuit is limited by factors such as complexity, cost, time, and design constraints. The field programmable gate array (FPGA) refers to a type of logic chip that can be reprogrammed. Because of the programmable features, FPGAs are flexible and modification is almost trivial but, on the other hand, FPGAs are very expensive and have the largest die size. The relative disadvantage of FPGAs, however, is its high cost per function, low speed, and high power consumption. FPGAs are used primarily for prototyping integrated circuit designs but once the design is set, faster hard-wired chips are produced. Programmable gate arrays (PGAs) are also flexible in the number of possible applications that can be achieved but are not quite as flexible as the FPGAs and are more time-consuming to modify and test. An application specific integrated circuit (ASIC) is another type of chip designed for a particular application. ASICs are efficient in use of power compared to FPGAs and are quite inexpensive to manufacture at high volumes. ASICs, however, are very complex to design and prototype because of their speed and quality. Application Specific Standard Products (ASSPs) are hard-wired chips that meet a specific need but this customization is both time-consuming and costly. An example of an ASSP might be a microprocessor in a heart pacemaker.

A digital system can be represented at different levels of abstraction to manage the description and design of complex systems with millions of logic gates, etc. For instance, a circuit diagram or a schematic of interconnected logic gates is a structural representation; a picture of a chip with pins extending from the black box/rectangle is a physical representation; and the behavioral representation, considered the highest level of abstraction, describes a system in terms of what it does, how it behaves, and specifies the relationship between the input and output signals. A behavioral description could be a Boolean expression or a more abstract description such as the data register transfer level logic (RTL). RTL descriptions are specified by the following three components: (1) the set of registers in the system or subsystem, such as a digital module; (2) the operations that are performed on the data stored in the registers; and (3) the control that supervises the sequence of the operations in the system.

Specialized electronic design automation (EDA) software, referred to as tools, intended to implement a more efficient process to design chips has been introduced. Integrated circuits are now designed with the EDA tools using hardware description languages, typically Verilog or VHDL. VHDL stands for VHSIC (Very High Speed Integrated Circuits) Hardware Description Language, the development of which was sponsored by the U.S. Department of Defense and the IEEE in the mid 1980s. VHDL and Verilog are only two hardware description languages but seem to have become the industry's standard languages to describe and simulate complex digital systems and incorporate timing specifications and gate delays, as well as describe the integrated circuit as a system of interconnected components. Execution of programs in hardware description languages are inherently parallel meaning that as soon as a new input arrives the commands corresponding to logic gates are executed in parallel. In this fashion, a VHDL or Verilog program mimics the behavior of a physical, usually digital, system.

In spite of the implementation of EDA tools, chip designers and testers still manually define the specification and address map for individual registers and internal memory, as well as separately and manually specify the implementation at the RTL, the verification testcases, and the firmware header file. Maintaining consistency and manually editing the multitude of minute modifications often required by this out-dated and tedious approach is very difficult and conducive to many mistakes. There is thus a need in the industry for an automated RULES ENGINE that verifies that a data entry and data changes in any one of the several hundred parameters will be checked for correctness and propagated throughout the entire chip design.

SUMMARY OF THE INVENTION

To meet these and other needs in the industry, the inventors herein present a method, a computer program product, and a RULES ENGINE to validate data for use in the design of a semiconductor, which: reads a plurality of resources of an application set; reads a user's specification intended to be developed from and added to the application set in the design of the semiconductor product; allocates a resource to the design of the semiconductor product; validates the allocation of the resource to the semiconductor product; and propagates the allocation and plurality of parameters of the resource throughout a description of the semiconductor product. To assist with the verification, the names of some of the resources such as phase locked loops, clocks, oscillator sources, reset sources, memories, and I/O ports must be unique, non-null, comply with industry and/or company naming conventions and syntax. The name of some of the resources, moreover, are not duplicated in a user's module, a fixed module, or a generated module of the semiconductor product. The frequency output of an oscillator source, such as a phase locked loop, a primary I/O, or a recovered clock, are all checked to see if the source exists, the output is in an allowable range, and if the feedback and/or dividers and/or reference frequencies are consistent. The allocation of diffused or configured memory is verified for bit width, word length, and whether the resources exist for that width and depth of memory. If the memory is configured from transistor fabric of the semiconductor product, then the amount of transistor fabric allocated to the memory is automatically declared from the available resources. The method, RULES ENGINE, and program product herein also automatically update an index for allocated resources. If the resource is a diffused resource, then the physical reference is updated and made consistent with the allocation. for diffused resources as the diffused resources are allocated. If an I/O buffer is one of the resources allocated, the method, RULES ENGINE, and computer program product ensure that the I/O buffer type, the direction and differentiality of the signals, the reference voltage, if any, and the resource to which the I/O buffer are all compatible and consistent through the specifications of the semiconductor product.

The invention may further be considered a method and a RULES ENGINE to facilitate the design of semiconductor products, the method and engine reading in a plurality of resources available on an application set; reading in a plurality of resources available in and a plurality of requirements for a user's specification; allocating only those plurality of resources to the user's specification that are valid and compatible. If an allocation conflicts with other allocations, specifications, or otherwise renders the semiconductor product nonfunctional, the method and RULES ENGINE disallows the allocation.

The method and Rules Engine always ensures that the specification of the resources of a semiconductor product is always in a valid state.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

FIG. 1 is a simplified block diagram of a networked computer system in which language and template of the builder tool of the invention can be implemented.

FIG. 2 is a simplified block diagram of the functional components within a computer workstation to which an integrated circuit developer may access and use the language and template of the builder tool in accordance with an embodiment of the invention.

FIG. 3 is a simplified block diagram of a semiconductor platform having a number of components, each of which may be considered as generation tasks, having shells that may be generated using the templates and the language of an embodiment of the invention.

FIG. 4 is a simplified diagram illustrating the hierarchy of register transfer level logic of a platform description usable by the template and language of the builder tool in accordance with an embodiment of the invention.

FIG. 5 is a simplified flow chart illustrating how parameters in the language of the invention can be entered correctly and then, using the TEMPLATE ENGINE and the RULES ENGINE, generating correct shells for the design and manufacture of a semiconductor product FIG. 6 is a simplified flow chart illustrating a process to confirm the correctness of parameters for phase locked loops of a semiconductor product used in accordance with an embodiment of the invention.

FIGS. 7A and 7B are simplified flow charts illustrating a process to confirm the correctness of parameters for clocks and timing of a semiconductor product used in accordance with an embodiment of the invention.

FIG. 8 is a simplified flow charts illustrating a process to confirm the correctness of parameters for memories of a semiconductor product used in accordance with an embodiment of the invention.

FIGS. 9A and 9B are simplified flow charts illustrating a process to confirm the correctness of parameters for input/output buffers and signals of a semiconductor product used in accordance with an embodiment of the invention.

FIG. 10 is a screen shot of one example of how a user may select certain data and certain shells to generate in accordance with an embodiment of the invention.

FIG. 11 is a graphical user interface embodying a description of the resources available on a slice to be designed into a semiconductor product using the templates and the language as described herein.

FIG. 12 is a screen shot of a graphical user interface illustrating a completed I/O specifications table having correct parameters that have been checked against an embodiment of the rules and directives of the invention.

DESCRIPTION OF THE INVENTION

The present invention now will be more fully described with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough, complete, and will fully convey the scope of the invention to those skilled in the art. Like numbers may refer to like elements and process steps throughout.

Referring to FIG. 1, which illustrates an exemplary computer system 100 upon which a tool to validate the correctness and use of data during the design of a semiconductor product as disclosed herein, could be installed and/or used. Computer system 120 is illustrated as a networked computer system that includes one or more client computers 122, 124 and 130 such as workstations coupled through a network 128 to a server 126. Server 126 could also be a personal computer, a workstation, a midrange computer, or a mainframe computer. While shown here as a point-to-point connection, computers 122 and 124 need not be coupled to server 126 directly, but may be coupled to yet another network which in turn is connected to server 126. Network 128 represents any type of networked interconnection including but not limited to local-area, wide-area, wireless, and public networks such as the Internet or an Intranet, and any number of routers and hubs connected in between, e.g., a local-area network to a wide-area network to the Internet through a series of routers and/or other servers. Any number of computers and other devices may be networked through network 128, e.g., multiple servers, hand-held devices, etc.

For the purposes of the invention, computer 130 may represent practically any type of computer, computer system, or other programmable electronic device, including a client computer similar to computers 122, 124 of FIG. 1, a server computer, e.g., similar to server 126 of FIG. 1, a portable computer, an embedded controller, a hand-held device, etc. Computer 130 may be coupled in a network 128 as shown in FIG. 1 or may be a stand-alone device. Computer 130 will hereinafter also be referred to as a computer although it should be appreciated that the term "computer" may also include other suitable programmable electronic devices capable of allowing a chip designer to use the RULES ENGINE.

With reference to FIG. 2 wherein the method and apparatus of correctly generating shells and of validating the correctness of the data throughout the design process for a semiconductor product as disclosed herein is installed as an application on computer 230. Computer 230 typically receives a number of inputs and outputs for communicating information externally. For interface with a user or operator, computer 230 typically includes one or more user input devices 236, 237, e.g., a keyboard 136 and/or mouse 140 of FIG. 1, a trackball, a joystick, a touchpad, and/or a microphone, among others, and one or more output devices 232 such as a display 142 and/or a printer 144 of FIG. 1, a speaker, among others. Some servers, however, do not support direct user input and output. For additional storage, computer 230 may also include one or more storage devices 148 of FIG. 1, e.g., a floppy or other removable disk drive, a hard disk drive, a direct access storage device, an optical drive, e.g., a CD drive, a DVD drive, etc., and/or a tape drive, among others, that may be connected directly or other storage 246 that may be connected through a storage area network (SAN) or other network 228. Furthermore, computer 230 may include an interface connected to one or more networks 228, e.g., a local-area network, a wide-area network, a wireless network, and/or the Internet, among others, to permit communication of information with other computers 122, 124 coupled to the network 128. It should be appreciated that computer 230 typically includes suitable analog or digital interfaces between processor 240 and each of the components as is known in the art.

Computer 230 typically includes at least one processor 240 coupled to a memory 242. Processor 240 may represent one or more processors or microprocessors and memory 242 may represent the random access memory (RAM) devices comprising the main storage of computer 230, as well as any supplemental levels of memory such as cache memories, nonvolatile or backup memories, programmable or flash memories, read-only memories, etc. In addition, memory 242 may be considered to include memory storage physically located elsewhere in computer 230, e.g., any storage capacity used as a virtual memory, e.g., as stored on a mass storage device 246 coupled to computer 230 with a SAN or on another computer coupled to computer 230 via network 228.

Computer 230 may operate under the control of an operating system 250 such as a UNIX-based, LINUX-based, or WINDOWS-based operating system, as is known in the art, but is not so limited by the particular operating system, or indeed need not be under the control of any operating system. Operating system 250 typically executes various computer software applications, components, programs, objects, modules, etc., such as an executable program 252, etc. Although the tools and libraries 260 for developing an integrated circuit may be in memory 242, they need not be. The processor 240 may access the tools and libraries 260, the required data, other various applications components, programs, objects, modules, etc., resident on one or more processors in another computer coupled to computer 230 via a network 228, e.g., in a distributed or client-server computing environment whereby the processing to implement the functions of the correct shell generation tool may be allocated to multiple computers over a network.

In general, the program or method steps which cause a computer to validate correct data during the design of a semiconductor product, whether implemented as part of an operating system or a specific application, component, program, object, module, or sequence of instructions, will be referred to herein as the RULES ENGINE. The RULES ENGINE typically comprises one or more instructions that are resident at various times in various memory and storage devices in a computer, and that, when read and executed by one or more processors in a computer network, cause that computer to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Computer program code for carrying out operations of the present invention may execute entirely on the user's computer, partly on the user's computer, as a stand-alone software package, partly on the user's computer and partly on a remote computer or entirely on the remote computer. In the latter scenario, the remote computer may be connected to the user's computer through a network 128, for example, the Internet using an Internet Service Provider. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links.

One input to the RULES ENGINE is the application set. An application set is, inter alia, a description of the platform and several shells that make the platform useful to a chip designer. Viewing FIG. 3, a platform 310 is a partially manufactured semiconductor device in which the wafer layers up to the connectivity layers have been fabricated. The platform 310 comprises a base semiconductor wafer from, e.g., silicon, silicon-on-insulator, silicon germanium, gallium arsenide, other Type II, IIII, IV, and V semiconductors, etc. and is a piece of semiconductor material into which blocks or hardmacs have been diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory 320-328, 330-338, data transceiver hardware such as I/O PHYs 340-346, clock factories including phase-locked loops (PLLs) 450, control I/Os 352, configurable input/output (I/O) hardmacs 354, 356; each of the hardmacs have an optimum arrangement and density of transistors to realize its particular function. The platform further comprises an area of transistor fabric 360 for further development of the platform 310 using a suite of generation tools, each of which may incorporate the RULES ENGINE as described herein. Transistor fabric 360 is an array of prediffused transistors in a regular pattern that can be logically configured by the suite of generation tools herein to achieve different functions. A cell refers to the personalization of the interconnect layers that instantiate the logic gates of the transistor fabric. A memory compiler (not shown) may have compiled some blocks of diffused memory 320-338 for specific sizes, timing requirements, connections, etc. The placement of these hardmacs, compiled memories, and the reserved areas of the transistor fabric 360 have been situated to achieve the desired timing and performance both within the platform and for the platform 310 to connect externally.

One of skill in the art will appreciate that the platform 310 shown in FIG. 3 is only one example of a platform and its components. Different platforms may contain different amounts and arrangements of transistor fabric, different amounts of diffused and/or compiled memories, both fixed and configurable I/O blocks, clocks, etc. depending upon the purpose of the final integrated chip. For instance, if the final chip is intended to be a communication and/or network integrated circuit, the periphery of the platform may contain many I/O hardmacs that have been fixed as PHYs and/or that can be configured differently from one another. Likewise, if the final integrated chip is intended to be a specialized microprocessor then it may not have as many I/O hardmacs or configurable I/O, and more or less diffused registers and memories. The point is that there are different platforms for different semiconductor products. The platform 410, moreover, optionally may include the contact mask and some of the fixed higher layers of connectivity for distribution of power, ground, and external signal I/O.

The platform definition is a detailed listing of the physical resources features available on the platform, such as the area and availability of transistor fabric, the I/O and memory available, the requirements of the hardmacs, the cost of the platform, the ideal performance that can be expected of the platform, the expected power consumption, and other functional requirements. For memory elements, the platform definition may include, inter alia, details of: (a) area and physical placement of the memory array and its interface/connection pins; (b) bit width and depth; (c) organization, e.g., numbers of read/write ports, bit masking; (d) cycle time; and (e) power estimates. For I/O elements, the platform definition may provide, inter alia, the types of I/O, the I/O drive strength, etc. For clock elements, the platform definition provides the frequencies at which the platform may operate, the duty cycle, etc. Other details of the platform definition may include the configuration of the transistor fabric and the diffused and compiled elements, the status of the logic, the required control signals and the features enabled by the control signals, whether any element undergoes testing, the location and the number of the elements on the platform, etc.

The platform and its definition are of little use to a designer needing to develop a functional integrated circuit, so several representations of the diffused resources of the platform are needed; shells are these representations. Shells are the logic and other infrastructure that makes the platform useful as a design entity, and the RULES ENGINE described herein is preferably used to generate these shells. The platform description is input to circumscribe all other generated parameters and other user input to make the platform useful to design a semiconductor product. Using the RULES ENGINE and a suite of other generation tools, a chip designer can integrate her/his customer's requirements with the platform's resources and definition to verify and synthesize designs generated by each tool, insert clocks, create the test interconnects, and then integrate the designs together to create a complete design. The resultant design, moreover, is a qualified netlist with appropriate placement and routing amongst the existing resources and for external connections to a board. To create a customized chip, all that is needed is a small set of remaining masks to create the interconnections between the preplaced elements.

There are a number of shells used by a designer to integrate her/his customer's requirements using a particular platform description, and depending upon the designer's particular task; one or more of these shells can be used. While the following description is not intended to be limitative, it is nonetheless, fairly representative of the infrastructure necessary to use the platform and create a functional semiconductor product from the platform. These shells comprise: the RTL shells, the documentation shell, the verification shell, the synthesis shell, the static timing analysis shell, the manufacturing test shell, the floorplan shell, and the RTL qualification shell. The RTL shell provides a logical description of the platform, and the generated or user resources. The documentation shell may be considered the functional description of the resources. The verification shell is the functional verification description, and the synthesis shell may be thought of as the generation description. The static timing analysis shell is the timing description, the manufacturing test shell is the test description, and the floorplan shell is a location description of the platform resources.

An additional perspective of these shells may be obtained by abstracting the semiconductor product as modules based upon the source of the RTL and the function of the logic, such as shown in FIG. 4. One of skill in the art will understand that these shells are not necessarily generated according to this or any other abstraction; that is to say, a generated verification shell or any other shell may have aspects in one or more of these modules and that the shells are not necessarily generated in the order of or limited to the following modules. The information is presented to show the complexity and the interconnectedness of the shells with each other and with the modules throughout the semiconductor platform. The generated module 410 preferably comprises the shells generated by a suite of generation tools for I/O, memory, clocks, or may be derived from other known semiconductor design tools such as described in copending United States patent applications, commonly owned by the assignee herein and hereby incorporated by reference in their entireties: Ser. No. 10/435,168 filed 8 May 2003 entitled AUTOMATION OF THE DEVELOPMENT, TESTING, AND RELEASE OF A FLOW FRAMEWORK AND METHODOLOGY TO DESIGN INTEGRATED CIRCUITS; Ser. No. 10/318,792 filed 13 Dec. 2002 entitled FLEXIBLE TEMPLATE HAVING EMBEDDED GATE ARRAY AND COMPOSABLE MEMORY FOR INTEGRATED CIRCUITS; Ser. No. 10/318,623 filed 13 Dec. 2002 entitled AUTOMATED SELECTION AND PLACEMENT OF MEMORY DURING DESIGN OF AN INTEGRATED CIRCUIT, Ser. No. 10/334, 568 filed 31 Dec. 2002 entitled PLACEMENT OF CONFIG- URABLE INPUT/OUTPUT BUFFER STRUCTURES DURING DESIGN OF INTEGRATED CIRCUITS; Ser. No. 10/335,360 filed 31 Dec. 2002 entitled A SIMPLIFIED PROCESS TO DESIGN INTEGRATED CIRCUITS; Ser. No. 10/465,186 filed 19 Jun. 2003 entitled DESIGNING AND TESTING THE INTERCONNECTION OF ADDRESSABLE DEVICES OF INTEGRATED CIRCUITS; and Ser. No. 10/713,492 filed 14 Nov. 2003 entitled FLEXIBLE DESIGN FOR MEMORY USE IN INTEGRATED CIRCUITS. The generated module 410 may include some preplaced, timed, and proven components, such as one or more clock generators, system controllers and reset logic, test controllers, and/or analog serializers/deserializers (SERDES) hardmac components. The generated module 410 has connectivity requirements to the various modules and their components through bus logic 418 to the several modules along an internal bus 480 and/or external bus 482. Bus logic 418 may include arbiters, multiplexers, decoders, etc. to manage the connectivity and, if necessary, the address translation and register/memory coherence schemes.

Surrounding the generated module 410 is the user module 420. Logic from the customer for whom the integrated circuit is designed comprises the user module 420 and may include prefabricated logic and hardware such as cores, hardmacs, IOs, registers 422, etc. Also included in the user module 420 may be a list of memories and/or registers having tie-offs, i.e., the memories and/or registers that will not be used for data flow and may thus be allocatable for performance enhancing features such as control status registers, etc. The user module 420 also provides input into the RULES ENGINE described herein.

The fixed module 430 is created with the application set and thus encompasses the fixed resources and the shells pertaining to these fixed resources of the application set. The fixed module 430 and its accompanying shells provide the template upon which the customer's requirements will be built and are input into the RULES ENGINE described herein. The fixed module 430 may be as simple as logic signals directly connected to external chip I/Os, or it may be more complex logic upon which the user module 420 and the generated module 410 can build. For example, shells of the fixed module 430 could include the complete infrastructure to support a PCI bus controller 432, 432a including all the connections to external I/Os and/or a DDR/SRAM memory controller, a processor subsystem 436, 436a, etc. The RULES ENGINE herein accepts the shells of the fixed module 430 and then further facilitates matching and binding the memories, register blocks, any cores 436 in the fixed module to the top module 450, such as matching protocols and correctly binding the correct I/O hardmacs PHYs 452, such as an XGXS to support data transfer at Gigabit Ethernet speeds, or a MW SPI-4 core.

The core module 440 encompasses the fixed module 430 and the user module 420 and may be described as the correct and proven logic interfaces connecting them with each other and with the top module 450. The top module 450 contains the logic and supporting shells for the hardmacs and configured logic towards the periphery of the platform for outside communication. The top module 450 thus contains the I/O blocks and I/O diffused areas and any registers associated with the hardmac and configurable I/Os. The instantiated I/O blocks that use the top module 450 may include the PLLs, the I/O netlists of which a NAND tree is a part, test logic, and lock detect circuits, etc. A number of input tables describing the interconnect templates are used by the RULES ENGINE to integrate the bus masters of 452a 454a, 456a, 458a, 462a of their respective top module components 552, 554, 556, 558, 562 with the application set and the rest of the design. These top module components may include a JTAG TAP controller 456, an Ethernet interface 452, a CPU connection interface 454, and/or an EEPROM interface 458, etc., each of which may require special consideration when inputting associated parameters.

FIG. 5 is a simplified flow chart of a method 500 of generating correct shells for the platform and modules described in FIGS. 3 and 4. In FIG. 5, the process 500 begins at step 510 whereby the application set and user requirements of the user module and its shells are automatically input to the TEMPLATE ENGINE. At step 512, the RULES ENGINE and TEMPLATE ENGINE read the parameters of the application set and/or the user's specification, for example, the names of signals, names of inputs/outputs, etc., that will be used to generate a shell(s). At this time the input parameters of the shells are checked to ensure their correctness and completeness at step 514, preferably by the CORRECT DATA ENTRY and the RULES ENGINE. If the input parameters are not correct, then the process immediately loops back to step 512 giving the user an opportunity to enter correct shell parameters. If, however, the parameters for the shell are correct, the user selects a shell, such as an RTL, simulation, documentation shell, to generate at step 516. Then, at step 518, the shell(s) is/are automatically generated e.g. by allocating the appropriate data to its respective template, such as described the TEMPLATE ENGINE. After the shell is generated, then different paths of FIG. 5 are taken depending upon the particular shell. For instance, if the correctly generated shell is an RTL and/or simulation shell, then at step 522, the RTL is compiled. Note, that at this time, the RTL language and syntax will be correct and need not be checked. Then, the RTL is then simulated as in step 524 to determine how the actual signals will transfer from register to register, and the process returns at step 585. After generation of the correct documentation shell 530, the process returns. The correct timing shell 540 will undergo timing analysis at 542 and return. The correct manufacturing test shell 550 generated by the tool as described herein can be used to generate manufacturing vectors at step 552 which will be tested at step 554. The correct synthesis shell 560 will be run at step 562, and the correct floorplan shell 570 will generate a floorplan as in step 572. The RULES ENGINE as described herein ensures that the parameters input into it and other generation tools are correct, complete and comply with any rules and constraints put upon them.

FIG. 6 is one of the flowcharts of the RULES ENGINE that assures correct input and distribution of correct data into the specifications used to generate the shells for each component. FIG. 6 addresses the rules and directives for phase lock loops; FIGS. 7A and 7B present a flow of the process whereby parameters and specifications of clocks are confirmed for correctness by the RULES ENGINE. FIG. 8 is a flowchart of the rules and directives for the memories of a semiconductor product. FIGS. 9A through 9B deal with the complexity of checking the input/output buffers and signals for correctness by the RULES ENGINE during the generation of shells. One of skill in the art will of course realize that the concept and the rules and directives herein are not limited to PLLs, clocks, memories, and I/O buffers, but can apply to complex hardmacs that have register spaces, such as processors. The figures are understandable knowing the nomenclature and conventions. An arrow connecting a block to itself or other blocks means that the values or names in the block are consulted to obtain new values or names and/or are changed as a result of a change in the first block. The numbers around a box indicate the order of evaluation. And notion of xCy means that x is conditional on y being true whereas the notation xCyF means that x is conditional on y being false.

There are preferences for the syntax for signal names, as outlined in the TEMPLATE ENGINE, filed concurrently herewithin, but which will be reiterated here for convenience. Signal names preferably contain A-Z, a-z, 0-9, _, and [ ], and start with A-Z or a-z. Multiple underscores _____ tend to be burdensome and uninterpretable given the language and syntax and are therefore discouraged. Numbers are allowed only between brackets, such as [12345678]. For floating point numbers, it is preferred that they do not contain exponential notation and be less than one million. Integers are preferably numeric characters with a maximum number of nine characters.

Following is a list of some of the parameters, data that could be included in the original data from the application set and/or the user's specification and/or generated during the process of chip design.

| | |
|---|---|
| Bump 904 | The location of the I/0 on the silicon die. |
| Package Ball 906 | The physical location on the package where a signal will be located. |
| Side 1202 | The side of the die where the signal is located. Possible values are: LEFT, RIGHT, TOP or BOTTOM. |
| Diff Pair 1204 | The matching bump to make up a differential pair. |
| Power Plane 1206 | This field indicates how the bump is used. Possible values are: Power, Signal, Ground, SignalPower, or SignalGround. |
| Segment | Segment Region of the power plane that the signal passes through. |
| Signal Name (Platform) 1020 | Name of the signal associated with the package location. The name chosen must comply with all signal name naming conventions. Refer to Naming Conventions. |
| Signal Name (User) 1024 | Name of the signal associated with the package location. You must choose a name that complies with all signal naming conventions. Refer to Naming Conventions. |
| Diffused I/O Type 940 | This field indicates the type of I/O buffer that is diffused onto the slice. Diffused I/O buffers can be configured or fixed. |
| I/O Direction 1050 | This field indicates the maximum capability of the I/O buffer. Possible values for this field are: IN, OUT, INOUT, or blank. |
| VREF or Bzgrp 910 (Platform) | If the buffer type require a VREF, this field identifies the signal name used as a voltage reference for the I/O buffer. If the buffer type is BZ I/O, this field indicates the EN Update Block that controls this buffer. |
| VREF or BZgrp (User) 920 | If the buffer type requires a VREF, this field identifies the signal name used as a voltage reference for the I/O buffer. If the buffer type is BZ I/O, this field indicates the EN Update Block that controls this buffer. |
| I/O Use (Platform) 1054 | This field indicates the direction of the I/O. It will automatically be filled in if the I/O Direction is IN, OUT, or blank. If the I/O direction is INOUT, possible values are IN, OUT, INOUT, or blank. |
| I/O Use (User) 1058 | This field indicates the direction of the I/O. It will automatically be filled in if the I/O Direction is IN, OUT, or blank. If the I/O direction is INOUT, possible values are: IN, OUT, INOUT, or blank. |
| Configurable I/O Type (Platform) 950 | This field indicates what type of configurable I/O buffer is being used. |
| Configurable I/O Type (User) 1040 | This field indicates what type of configurable I/O buffer is being used. |
| Component Type 960 (Platform) | Type of component to which the signal is being routed. The possible values are: None, PLL, GigaBlaze core, HyperPhy core, DDR, and UCM. |
| Component Name 970 (Platform) | The name of the component to which that signal will connect. A drop-down list is generated for each component type. |
| Component Port 1060 (Platform) | Name of the port on the component to which that signal connects. A drop-down list is generated that is dependent on the component type and name. |
| Component Type (User) 990 | Type of component to which the signal is being routed. The possible values for component types are based on what Component Type (Plafform) was chosen. |
| Component Name (User) 1010 | The name of the component to which the signal will connect. |
| Component Port (User) 1070 | Name of the port on the component to which the signal connects. |
| Test Usage (Platform) 1066 | This field states if the signal is to be used for test purposes. Possible values are: No Test, Dedicated, Shared and Reserved. |
| Description 1210 | Used to enter additional description about the primary I/O. |
| Note 1212 | Use this field to add any additional information about the primary I/O. |
| Setup Time (ns) | A requirement specifying the minimum time in nanoseconds that the data must be stable on the pin prior to the capturing clock edge. |
| Capture Clock | The name of the clock used to capture data on input ports. A drop-down list is generated from the list of all clocks defined in the Clock Specifications Table. |
| Output Time (ns) | A requirement specifying maximum time in nanoseconds between the sourcing clock edge and the point at which the data will be stable. |
| Sourcing Clock | The name of the clock used to launch data on output ports. A drop-down list is generated from the list of all clocks defined in the Clock Specifications Table. |
| Cap Load (pF) | The amount of capacitive load on the I/O buffer. |
| Clock Name 720 | The name of the clock component. This must be a unique name. Refer to the Naming Conventions section. |
| Clock Mode 740 | The mode of clock output for a clock factory element. This defines how many outputs the clock factory element needs. Possible values are: Nominal, Nominal Early, Nominal Late, or Nominal Early Late. |
| Frequency 780 | This field is computed. The value of this field is the result of the value in the Oscillator Source Frequency field divided by the value in the Divider field. |
| Osc Source Frequency | The divider for the Oscillator Source Frequency. |
| Divider 730 | Alternate Clock Creates a clock with a multiple selection source |

-continued

| | |
|---|---|
| Osc Source Type 770 | The oscillator source for the clock component. Possible values are: Primary I/O, PLL, or Recovered Clock. |
| Osc Source Name 750 | The logical name of the oscillator source. If the Oscillator Source Type is Primary I/O, then this field is the name of a primary I/O. If the Oscillator Source Type is Recovered Clock, then this field is the name of a UCM port. If the Oscillator Source Type is PLL, then this field is the name of a PLL. |
| Osc Source Frequency 760 | The frequency of the oscillator source. |
| Reset Source Name 790 | The name of the reset source for the clock component. If the name does not match any primary I/O name, then a UCM port is created with the Reset Source Name. |
| PLL Name 602 | The logical name for the PLL component. Each PLL component must have a unique name. |
| PLL Type 630 | The type of PLL component. |
| Physical Reference 632 | Reference location to a unique PLL on the slice. |
| Output Frequency 614 | The output frequency of the PLL. This value is determined from the Feedback Divider and Reference Frequency. |
| Feedback Divider 624 | The divider for the Reference Frequency. |
| Reference Frequency 626 | Used to derive the output frequency. This is required to achieve the Output Frequency. |
| Memory Name 820 | The logical name for the memory component. Each memory component must have a unique name. Refer to Naming Conventions. |
| R-Cell Only 840 | A value that indicates if the logical memory component should be created from R-Cell only or if the tool should choose between R-Cell and diffused elements. A value of True, forces the tool to create a memory logical component from R-Cells. A value of False, allows the tool to choose between diffused and R-Cells when creating a logical memory component. This field can only contain a true or false value. |
| Memory Ports 874 | The number of ports for the logical memory component. Possible values are: 1 read-write, 2 read_write, and 1 read and 1 write. |
| Number of Words 830 | The number of words for the logical memory component. The number of words defines the depth of the memory. |
| Number of Bits 850 | The number of bits for the logical memory component. The number of bits defines the width of the memory. |
| Frequency (MHz) 880 | The desired frequency of memory. |
| Pipeline Stages. 890 | Defines how flip-flops will be placed in memory access paths to assist in timing. Possible values are: Flop In, Flop Out, Both, or None |
| Error Protection 876 | This field indicates if error protection logic should be built and the memory size adjusted accordingly for the logical memory component. Possible values for this field are ECC, Parity, or None. |
| Physical Reference(s) 860 | Specifies the exact Diffused Memory Element(s) to use when constructing a logical memory. This field does not apply if the memory component is built using R-Cells. For diffused memories, if the user does not select a physical reference, the tool selects one. |

As a result of using the TEMPLATE ENGINE and CORRECT DATA ENTRY with the RULES ENGINE herein, component types picked by a user or customer match the component type of application set or the user module or not at all. The terms in parenthesis, Platform and User, such as on the charts as in FIG. 9A VREF (Platform) or in FIG. 9B Component Port (User), indicate whether the component is part of the application set as defined herein earlier, i.e., a partially manufactured semiconductor device that can be further developed by the user into a customized semiconductor product, or whether the component is added by the user in finalizing her/his integrated circuit design. Of course, an intermediate purpose of the TEMPLATE ENGINE and the RULES ENGINE is to generate the shells that are necessary and facilitate the design and manufacture of semiconductor products. Examples of some of the rules of the RULES ENGINE are that at the time of generating the shells, the method herein checks that the port per instance must be unique for single ended buffer types. The port can be duplicated only for differential buffer types. Uniqueness of the I/O names is checked, as well as assuring that the ports for the core module and the user core module are unique and are defined. Single bit buses, moreover, are either not allowed or discouraged. The rules pertaining to each resource will be further explored.

FIG. 6 applies the rules and directives applicable to the parameters of the specifications table of phase lock loops (PLL). At step 602, a PLL, of which there may be more than one on the application set, or in the customer's requirements is given a name. The RULES ENGINE herein applies four checks to the block labeled PLL Name 602: first, the name must be unique and non-null as indicated along path 604. If the name is unique and non-null, then the name is checked to determine if it is unique at the core module, the user module, the fixed module, and the generated module (see FIG. 4 and discussion herein) along path 606. Below is a basic checklist of some of the ports in the modules to consider: the core module components, ports of the generated modules, the input signals and output signals of the generated modules, such as the test signals, the reset source name, the oscillator source name, companion enable, i.e. the Alternate Clock and select signal for the companion enable, and the Reset Pulse Source whose signal could end with _RST_PULSE_SRC_N. The output signals of the generated module could include the test signals, the clock name, and the reset name. The fixed module has its ports, input signal names and output signals names; as does the user core module. One of skill in the art will further recognize that there may be proprietary name rules, checks and requirements to be included in these figures and conventions. If the name is unique within these modules, i.e., condition 2 is true, then, at 3 along path 608, the oscillator source name (750 in FIG. 7A) must be updated, if the PLL is used as the source of oscillation. At 4, paths 610 and 612, the component names of the platform and user (970 and 1010 in FIG. 9A), respectively, must be updated.

Block 632 of FIG. 6 refers to a physical reference indicating that the PLL is a diffused resource; the RULES ENGINE will check that the name of the physical reference is non-null, unique, and complies with signal base syntax, either conventional and/or proprietary, see e.g., columns 632 of FIGS. 10 and 1330 of FIG. 11. Block 630 refers to the type of PLL, and example of which is given in column 1328 of FIG. 11. Of course, they may be different types of PLL, each given a unique index as in block 660 and perhaps each having their own rules, consistency checks, etc. The range and naming conventions of the output frequency 614 is checked along path 616 so the value chosen for the output frequency is within an allowable range. Then at path 618, the feedback divider 624 may be changed along path 628 to maintain the reference frequency 626. If, however, given an output frequency or a change in the output frequency 614, the feedback divider and the output frequency cannot be maintained, as in path 620, then the reference frequency 626 needs to be changed. If the output frequency 614 has changed, oscillating source frequency (760 in FIG. 7A) is updated along path 622.

Referring now to the FIGS. 7A and 7B, which applies rules and directives for the correct clock naming and actions. An index 710 is maintained; there usually is more than one clock name or clock, sometimes up to sixty or more for a communications semiconductor product, in the design so the index helps to keep track. At block 720, a clock name is checked at loop 604, to validate that the name is unique, non-null, and compiles with the conventions and/or requirements for signal names. In loop 606, the name is checked to determine it is unique at the core module level indicating that name is not duplicated in the user module, the fixed module, and the generated module. Then, at path 722, if the name of the clock is changed, then the change may also propagate and affect the alternate clock 732 which must also have a unique, non-null, name compliant with naming syntax conventions and proprietary requirements. If, however, a user performs a row delete operation on the clock specifications table, as in FIG. 7B path 734, then the RULES ENGINE determines if the alternate clock 732 should also be deleted or is otherwise affected.

At block 730 a change in the divider's value updates the frequency 780 along path 628. Also affecting frequency 780 is a change in the oscillator source frequency 760 to maintain an appropriate range. The oscillation source frequency 760 must comply with floating point syntax, as along path 604. Note that along path 622, a change in the output frequency of the connected PLL (614 in FIG. 6) also affects the oscillation source frequency 760.

Block 750 refers to the oscillation source name, which preferably is non-null and complies with signal base syntax. If the oscillator source 750 is a PLL (as in 602 of FIG. 6), or a primary input/output (I/O) signal, or a recovered clock, the RULES ENGINE herein verifies the name also exists in the table for PLLs and I/Os. The name of the oscillator source 750 must be unique throughout the models, as along path 606. Also affecting the oscillator source name 750 is the oscillator source type 770 in FIG. 7B; a change in the oscillator source type 770 ripples along path 752 to the oscillator source name 750. Path 752 of the RULES ENGINE chooses a name for the oscillator source name 750 depending upon whether the source is a PLL, a primary I/O, or a recovered clock. Likewise, a user's change of the signal name (1024 in FIG. 9B) can affect the oscillator source name 750, as in path 758, depending upon the present value of the signal name. If the name exists as the oscillator source name 750 and if the oscillator source type 770 is a primary I/O signal, then the oscillator source name 750 is set to a new value and the RULES ENGINE applies this change to a clock specification table similar to the I/O specification table of FIGS. 10 and 12.

Referring to FIG. 7B, the oscillator source type 770 is given a name which along path 772 must be unique, non-null. If, moreover, a PLL has not been defined in the PLL specification, the oscillator source type 770 cannot be a PLL; similarly, if no primary I/Os have been defined in the I/O specifications, then the oscillator source type 770 cannot be a primary I/O. The changes of the oscillator source type 770 also affect the oscillator source frequency 760 along path 762, and affect the oscillator source name 750, as discussed.

The reset signal is named as in block 790 of FIG. 7B and its name must be non-null and comply with the signal name base syntax and industry and/or company conventions. The reset source name 790 is connected to the signal name defined by the user (1024 in FIG. 9B) such that if the user changes or creates a name for the reset signal coming from the reset source 790, the RULES ENGINE also changes the reset source name 790. These rules and directives are only examples of what might be implemented when designing and instantiating a clock for a semiconductor product. A table may be constructed with all the parameters; if a rule or directive limits the choices for a particular clock, those limited parameters will be offered, or grayed out, or otherwise made to be not available during the correct entry of the parameters.

FIG. 8 is an example of how the rules and directives and influences in specifying memory in a semiconductor product can be applied. An index 810 of the memory usage is created and a memory is given a name in 820 which must be unique, non-null, and comply with any syntactic requirements and conventions. The number of words in a memory are input in block 830 and the bit width of each word is input at block 850 and the RULES ENGINE herein automatically verify the numbers of words and bit width are valid, i.e., the depth and width of the words are allowable and the input value complies with the syntax requirements, such as integer base. Along paths 832 and 852, once the depth and width are validated, the physical reference 860 to the diffused memory of platform resources are updated. The physical reference 860 will be checked at 604 to see if it satisfies the requirements of other fields, such as words 830, bits 850, ports 874, and if so, the physical reference 860 is allowed.

Along path 842, if memory is configured from the transistor fabric, labelled R-cell 840, the Rules Engine will consult and update the resource viewer of FIG. 11 by checking if there are any Rcells available as in block 1348 and then updating block 1346 to indicate that the some of the transistor fabric has been allocated, as in block 1346.

FIGS. 9A and 9B present the rules and directives for the I/O specifications to incorporate the platform resources with the user's requirements to achieve a semiconductor product. The parameters can be conveniently categorized into user requests and platform resources. Such requests and resources presented in FIG. 9 are not intended to be limitative but rather, are examples of platform resources and user's requests. Reference voltage of the platform 910 and the reference voltage specified by the user 920 are two such resources and requests. The RULES ENGINE checks the reference voltages of both or either the platform 910 and the user 920 to determine if the name complies with syntactic requirements, as along path 604. In this instance, an empty string for the value of the voltage is acceptable. In a preferred embodiment, the reference voltage is always derived from an external I/O source, so the RULES ENGINE confirms that the I/O buffer type is correct for a reference voltage. The RULES ENGINE further verifies that the names and values also exist in the Signal Name blocks of the platform 1020 along path 932 and that the new value exists in the Signal Name block of the user 1024 along path 922, respectively.

Blocks 930, 1020, and 1024 refer to I/O signal names and, in particular, the signal Names of the Bondout, the Platform, and those given by the User, respectively. The names of signals of the slice specification are read into block 930 Signal Name (Bondout) and becomes the default names for the Signal Name (Platform) 1020 along path 932. If the name of the I/O signal is changed when further developing the platform, then that name may be propagated to Signal Name (User) 1024 along path 1022. Thus the Signal Name (Bondout) 930 may be considered the default, and a chip developer can change the signal names at the platform level at Signal Name (Platform) 1020 and/or at the user level at Signal Name (User) 1024. In any event, when the I/O signal name is defaulted from the Signal Name (Bondout) 930 or defaulted from the Signal Name (Platform) 1020, the signal name in Signal Name (User) 1024 is also reflected in the Reset Signal Name (790 in FIG. 7b) along path 792 if the signal is a reset signal, or is reflected in changes in the oscillator source name FIG. 7A along path 758. The signal names at the various levels, i.e., the Signal Name (Bondout) 930, Signal Name (Platform) 1020, and Signal Name (User) 1024 are checked by the RULES ENGINE to ensure that the name complies with industry, proprietary, syntactic conventions and requirements. The RULES ENGINE may also verify that the I/O signal names at any of these levels, i.e., bondout, platform, user, represent that the signal may be dedicated to test usage such as for JTAG, test insertion, tree optimization, etc. If, moreover, any of these I/O signals are intended to be used for reference voltage signals at either the platform or user level, changes in the names or other parameters will be propagated to the VREF (Platform) along path 914 and/or VREF (User) along path 922.

By default, the RULES ENGINE loads all I/O buffers into Diffused I/O type 940, but if there is a label to state that an I/O buffer is configurable, then that buffer is also loaded into the Configurable I/O type (Platform) 950 and the Configurable I/O type (User) 1040. Configurable I/O type (Platform) 950 may be configured as an I/O buffer type for a Configurable I/O type (User) along path 954 or remain as an Configurable I/O type (Platform) 950. The parameters associated with the I/O types 940 and/or 1040 include the I/O direction of which that I/O buffer is capable, i.e., can the I/O buffer be INOUT, IN, or OUT. The Rules Engine further is aware that some of the parameters are determined by the type of I/O buffer; an I/O buffer type is determined by, inter alia, its electrical characteristics, such as voltage levels, differentiality, etc. Examples of different types include HSTL, SSTL, LVDS, PECT, etc. Thus, the actual use, e.g., whether IN or OUT or INOUT, of a Diffused I/O buffer type 940 is recorded in I/O Use (Platform) 1054 along path 944 and/or in I/O Use (User) block 1058 along path 942. Similarly, the actual I/O platform use of an I/O configurable buffer is indicated along path 1052 in block I/O Use (Platform), and the actual I/O use of a user's configurable I/O 1040 is indicated along path 1044 in I/O Use (User) 1058. If a test feature is selected in Test Usage (Platform) 1066 for an I/O diffused buffer 940, the RULES ENGINE verifies that the I/O buffer allows tests for a matching bump is differential signal pair. Similarly if the I/O buffer is input or output for a differential signal, the RULES ENGINE confirms that there are two rows (bumps) right next to each other and identifies the polarity. If an I/O buffer is selected for an I/O signal in a major power plane, the RULES ENGINE verifies that that the voltage level jof the signal is compatible with the power plane.

Also represented in FIGS. 9A and 9B are checks for the components used by the platform and the user. Each component is characterized by its type, its name, and its port. If a platform implements a component, that component type (platform) of block 960 is checked first to determine if the component type exists in the design along path 604. The I/O buffer and the component type must be compatible, e.g., if the I/O buffer, whether diffused or configurable, is to be connected to a PLL, or an I/O hardmac, such as GIGABLAZE or HYPERPHY, then the RULES ENGINE verifies compatibility. If the component type is part of the user module, the RULES ENGINE verifies that this component type is allowable, is not a test signal, or a major power plane, such as along path 962. If all these conditions on path 604 associated with block 960, then along path 962, the value may also be set in the component type (user) block 990; otherwise if used by the platform its name is tracked in block 970 along path 972 for the same parameters.

The RULES ENGINE and the TEMPLATE ENGINE are used to create instantiated and formatted shells used in the creation, the design, and the manufacture of semiconductor products. Data is obtained from a data base, preferably using the enumerated lists or input checking, such as described in CORRECT DATA ENTRY, that ensures correct data. The TEMPLATE ENGINE specifically addresses issues such as the syntax of the language and the structures common in hardware design used in semiconductor integrated circuit.

The TEMPLATE ENGINE and the RULES ENGINE described herein are part of a builder tool that automatically manages slice resources from an application set and builds RTL code for memories, I/Os, and clocks of a semiconductor product. In one embodiment, the builder tool uses input tables of specifications to assign I/Os, clocks, PLLs, and memories; other input techniques include notebooks of circuit diagrams, graphical representations of the architecture, etc. The builder tool can be installed as an application on any client or any server accessible through a network to a client computer. First, a user might select to create a design and then, in the preferred embodiment, a screen of the tool's selection tables as is shown in FIG. 10 is displayed. As is typical in a networked environment, the RULES ENGINE can be applied to multiple data files across a network.

In fact, the top module can be completely generated using the builder tool using the RULES ENGINE as described herein. Logical memories and clocks can be added and/or deleted. To add a logical memory/clock, the designer may click the Memories/Clocks and select Add on a menu bar of a graphical user interface. In one embodiment, a new row will be added to a memory/clocks specifications table. Logical memory/clocks may be deleted and upon deletion, the memory/clock will be deleted from its respective Memory/Clocks Specifications Table. Of course, more than one memory/clock may be deleted at a time by highlighting cells in multiple rows for the memories/clocks to be deleted.

Bus declarations may be entered easily using the builder tool. A bus is a group of input/output ports that share a common signal name. An bus can be declared by specifying a signal name having an individual bit in square brackets representing a starting index, for example, bus_name[5_____]. A user could simply highlight a range of ports, assign a common base name, and then from a starting index, a user could simply increment or decrement the ports on that bus. Optionally, a user can manually change each port or use other copy/paste techniques. In one embodiment of the TEMPLATE ENGINE, one bit buses are not allowed; indices are contiguous, and the least significant bit is zero.

A screen shot of a resource viewer is shown in FIG. 11. The resource viewer may list the technology and the name of the semiconductor platform. The technology of the chip, typically referring the gate length of the transistors, may be presented at 1302, and the name slice at 1304. The resource viewer 1300 has several windows which list the I/O resources 1306 available for development, the PLL resources 1324 available for development, the I/O resources of the coreware 1334, i.e., the hardmacs and/or logical functions that are available for design, instantiated, and ready for use, and the memory resources 1344. Each of these windows may have a pull-down window, hypertext links, or other known method to expand the view into the windows for a more complete lists of the factors and parameters affecting a particular resource. For I/O resources 1306, the resource viewer 1300 may display how many signal I/Os have been used, and how many are available. For phase locked loops (PLLs)1324, hardmacs 1334, and diffused memories 1344, the resource viewer 1300 may display if a specific component is used or unused 1326, 1358, the type of component, and the physical reference of any diffused I/O components, e.g., 1330, 1354. For logical memories to be configured from the transistor fabric, the resource viewer may display how much transistor fabric has been used 1346 and how much is available 1348. In some embodiments, there may be a limitation to the amount of transistor fabric that can be utilized for memory, e.g., only 25 percent.

An example of how to use a partially completed I/O table is shown in FIG. 12; a designer may wish to edit a signal. The designer first locates the signal to be edited in a row 1504 of the table and may change the name in the Signal Name (User) 1024 column if needed. Then, in the Config IO Type (User) 1040 column, the user may select the cell she/he wishes to configure and either selects an appropriate I/O buffer from the drop-down list or enter one in accordance with CORRECT DATA ENTRY. The RULES ENGINE will verify that the selected buffer is at the same voltage level as all other buffers on the same power segment, i.e., the buffer name indicates the voltage level of the buffer. For bidirectional buffers, I/O Use (Platform) 1054 which is indicated as INOUT, the designer may select how the I/O is going to be used in the I/O Use (User) 1058 column. Under the Component Type (User) 990 column, the chip designer may select the User Module (UM) option from the drop-down list which may appear in the cell. In accordance with the RULES ENGINE herein, if a chip designer (user) attempts to enter an illegal connection, an error dialog box will appear and the attempted modification may be ignored. Any of these methods of editing the contents of the specifications tables will invoke the algorithms that implement the RULES ENGINE to ensure that the modifications, additions, deletions are constantly updated and continuously valid throughout the design.

Using the Clock Specifications Table, a user may configure a clock from a PLL by first adding a clock to the table and in the Osc Source Type column, select or entering a PLL. In the Osc Source Name column, the user is requested to change the name to the desired PLL and, if desired, to change the clock name in the Clock Name field. The value in the Divider column is changed and will automatically change the clock frequency. Then the reset source is set; if the user wants the reset to come from a primary I/O, she/he is requested to enter the name from the Signal Name (User) column into the Reset Source column.

While the description provides embodiments of the invention, the embodiments are considered illustrative and by way of example only and are not intended to be limitative.

What is claimed is:

1. A method to validate data used in a design of a semiconductor product, the method comprising the steps of:
    (a) reading a plurality of resources of an application set, the application set defining the semiconductor product in a partially fabricated state comprising a plurality of fabricated layers up to and including a first conductive layer;
    (b) reading a user specification that (i) is developed based upon the application set at the partially fabricated state and (ii) establishes at least one upper conductive layer added to the application set that completes the design of the semiconductor product;
    (c) allocating a new resource from the user specification to the design of the semiconductor product, said new resource having a plurality of parameters;
    (d) validating the allocation of the new resource to the semiconductor product against the resources of the application set; and
    (e) propagating the allocation of the new resource and the parameters throughout a description of the semiconductor product, wherein step (d) comprises the sub-step of
    validating that a name of the new resource is all of (i) unique, (ii) non-null and (iii) complies with at least one of (a) an industry naming convention, (b) a company naming convention and (c) a syntax.

2. The method of claim 1, wherein step (d) comprises the sub-step of:
    validating that the name is not duplicated in any of (i) a user module, (ii) a fixed module defined in the partially fabricated state and (iii) a generated module defined by the user specification of the semiconductor product.

3. The method of claim 1, wherein an index is maintained for at least one of the following resources: phase locked loops, clocks, oscillator sources, reset sources, memories, and I/O ports.

4. The method of claim 1, wherein step (d) comprises the sub-step of:
    determining that a range of an output frequency of a phase locked loop is within an allowable range of the semiconductor product.

5. The method of claim 1, wherein step (d) comprises the sub-step of:
    validating an output frequency of a phase locked loop by changing one of (i) a feedback divider to maintain a reference frequency and (ii) the reference frequency to maintain both (a) the feedback divider and (b) the output frequency within respective allowable ranges of the semiconductor product.

6. The method of claim 1, wherein step (d) comprises the sub-step of:
    propagating both (i) a first name and (ii) a first output frequency of a phase locked loop as (a) a second name and (b) a second frequency of an oscillator that generates a clock signal.

7. The method of claim 1, wherein step (d) comprises the sub-steps of:
    validating that a name of an oscillator source is compatible with a respective type of oscillator source; and
    validating that the respective type of oscillator source is listed in a clock specification.

8. The method of claim 1, wherein step (d) comprises the sub-step of:
    validating that both (i) a number of words and (ii) a bit width allocated to a memory resource are allowable.

9. The method of claim 1, wherein (i) the resources of the semiconductor product comprise diffused resources and (ii) step (d) comprises the sub-step of:

updating a physical reference of the diffused resources as the diffused resources are allocated.

10. The method of claim 9, wherein the step of updating the physical reference comprises the sub-steps of:
   determining if a memory is to be configured from a transistor fabric resource; and
   determining if a sufficient amount of the transistor fabric resource is available.

11. The method of claim 1, wherein step (d) comprises the sub-steps of:
   validating that an I/O buffer utilizes a reference voltage;
   validating that the reference voltage is available in the application set; and
   assigning the reference voltage to the I/O buffer.

12. The method of claim 1, wherein step (d) comprises the sub-steps of:
   validating if an I/O signal is a differential signal;
   validating that a plurality of adjacent bumps are available to an I/O buffer handling the I/O signal;
   validating that the I/O buffer is of a type compatible with the I/O signal; and
   identifying a polarity of the adjacent bumps.

13. A program embedded in a medium capable of being read and executed by a computer, the program comprising the steps of:
   (a) reading a plurality of resources of an application set, the application set defining a semiconductor product in a partially fabricated state comprising a plurality of fabricated layers up to and including a first conductive layer;
   (b) reading a user specification that (i) is developed based upon the application set at the partially fabricated state and (ii) establishes at least one upper conductive layer added to the application set that completes the design of the semiconductor product;
   (c) allocating a new resource from the user specification to the design of the semiconductor product, said new resource having a plurality of parameters;
   (d) validating the allocation of the new resource to the semiconductor product against the resources of the application set; and
   (e) propagating the allocation of the new resource and the parameters throughout a description of the semiconductor product, wherein step (d) comprises the sub-steps of
   validating that a plurality of names of the resources comply with at least one of (i) an industry naming convention, (ii) a company naming convention and (iii) a syntax, and
   validating that the name of at least one of the resources is both (i) non-null and (ii) unigue throughout a hierarchy of logical modules of the semiconductor product.

14. The program of claim 13, wherein step (d) comprises the sub-step of:
   validating that one or more I/O buffers can accommodate respective differential signals.

15. The program of claim 14, wherein step (d) further comprises the sub-step of:
   validating that the I/O buffers are of types compatible with the differential signals.

16. The program of claim 13, wherein step (d) comprises the sub-step of:
   validating that a clock type of a clock signal is compatible with a source of the clock signal.

17. The program of claim 16, wherein the source is from a group including: phase locked loops, primary I/O signals and a recovered clock.

18. The program of claim 16, wherein step (d) further comprises the sub-step of:
   validating that a clock frequency of the clock signal is compatible with the source.

19. The program of claim 13, wherein step (d) comprises the sub-step of:
   validating that an I/O buffer is compatible with both (i) a connected component and (ii) one or more electrical characteristics of the connected component.

20. The program of claim 13, wherein step (d) comprises the sub-step of:
   validating that an I/O buffer is compatible with at least one of (i) one or more power levels and (ii) one or more testing criteria.

21. A method to validate data used in a design of a semiconductor product, the method comprising the steps of:
   (a) reading a plurality of resources of an application set, the application set defining the semiconductor product in a partially fabricated state comprising a plurality of fabricated layers up to and including a first conductive layer;
   (b) reading a user specification that (i) is developed based upon the application set at the partially fabricated state and (ii) establishes at least one upper conductive layer added to the application set that completes the design of the semiconductor product;
   (c) allocating a new resource from the user specification to the design of the semiconductor product, said new resource having a plurality of parameters;
   (d) validating the allocation of the new resource to the semiconductor product against the resources of the application set; and
   (e) propagating the allocation of the new resource and the parameters throughout a description of the semiconductor product, wherein step (d) comprises the sub-steps of
   validating that a name of an oscillator source is compatible with a respective type of oscillator source, and
   validating that the respective type of oscillator source is listed in a clock specification.

22. A method to validate data used in a design of a semiconductor product, the method comprising the steps of:
   (a) reading a plurality of resources of an application set, the application set defining the semiconductor product in a partially fabricated state comprising a plurality of fabricated layers up to and including a first conductive layer;
   (b) reading a user specification that (i) is developed based upon the application set at the partially fabricated state and (ii) establishes at least one upper conductive layer added to the application set that completes the design of the semiconductor product;
   (c) allocating a new resource from the user specification to the design of the semiconductor product, said new resource having a plurality of parameters;
   (d) validating the allocation of the new resource to the semiconductor product against the resources of the application set; and
   (e) propagating the allocation of the new resource and the parameters throughout a description of the semiconductor product, wherein step (d) comprises the sub-step of
   validating that both (i) a number of words and (ii) a bit width allocated to a memory resource are allowable.

23. The method of claim 22, wherein step (d) comprises the sub-step of:
   validating that a name of the new resource is all of (i) unique, (ii) non-null and (iii) complies with at least one of (a) an industry naming convention, (b) a company naming convention and (c) a syntax.

24. A method to validate data used in a design of a semiconductor product, the method comprising the steps of:

(a) reading a plurality of resources of an application set, the application set defining the semiconductor product in a partially fabricated state comprising a plurality of fabricated layers up to and including a first conductive layer;

(b) reading a user specification that (i) is developed based upon the application set at the partially fabricated state and (ii) establishes at least one upper conductive layer added to the application set that completes the design of the semiconductor product;

(c) allocating a new resource from the user specification to the design of the semiconductor product, said new resource having a plurality of parameters;

(d) validating the allocation of the new resource to the semiconductor product against the resources of the application set; and (e) propagating the allocation of the new resource and the parameters throughout a description of the semiconductor product, wherein (i) the resources of the semiconductor product comprise diffused resources and (ii) step (d) comprises the sub-step of updating a physical reference of the diffused resources as the diffused resources are allocated.

25. A method to validate data used in a design of a semiconductor product, the method comprising the steps of:

(a) reading a plurality of resources of an application set, the application set defining the semiconductor product in a partially fabricated state comprising a plurality of fabricated layers up to and including a first conductive layer;

(b) reading a user specification that (i) is developed based upon the application set at the partially fabricated state and (ii) establishes at least one upper conductive layer added to the application set that completes the design of the semiconductor product;

(c) allocating a new resource from the user specification to the design of the semiconductor product, said new resource having a plurality of parameters;

(d) validating the allocation of the new resource to the semiconductor product against the resources of the application set; and (e) propagating the allocation of the new resource and the parameters throughout a description of the semiconductor product, wherein step (d) comprises the sub-steps of validating that an I/O buffer utilizes a reference voltage, validating that the reference voltage is available in the application set, and assigning the reference voltage to the I/O buffer.

26. A method to validate data used in a design of a semiconductor product, the method comprising the steps of:

(a) reading a plurality of resources of an application set, the application set defining the semiconductor product in a partially fabricated state comprising a plurality of fabricated layers up to and including a first conductive layer;

(b) reading a user specification that (i) is developed based upon the application set at the partially fabricated state and (ii) establishes at least one upper conductive layer added to the application set that completes the design of the semiconductor product;

(c) allocating a new resource from the user specification to the design of the semiconductor product, said new resource having a plurality of parameters;

(d) validating the allocation of the new resource to the semiconductor product against the resources of the application set; and (e) propagating the allocation of the new resource and the parameters throughout a description of the semiconductor product, wherein step (d) comprises the sub-steps of validating if an I/O signal is a differential signal, validating that a plurality of adjacent bumps are available to an I/O buffer handling the I/O signal, validating that the I/O buffer is of a type compatible with the I/O signal, and identifying a polarity of the adjacent bumps.

* * * * *